US012785672B2

(12) United States Patent
Takatsu

(10) Patent No.: US 12,785,672 B2
(45) Date of Patent: Nov. 3, 2026

(54) SEMICONDUCTOR DEVICE

(71) Applicants: KABUSHIKI KAISHA TOSHIBA, Tokyo (JP); Toshiba Electronic Devices & Storage Corporation, Tokyo (JP)

(72) Inventor: Hirofumi Takatsu, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 62 days.

(21) Appl. No.: 18/758,311

(22) Filed: Jun. 28, 2024

(65) Prior Publication Data

US 2025/0007509 A1 Jan. 2, 2025

(30) Foreign Application Priority Data

Jun. 29, 2023 (JP) ................................ 2023-107034

(51) Int. Cl.
*H03K 17/0812* (2006.01)

(52) U.S. Cl.
CPC .................. *H03K 17/08122* (2013.01); *H03K 2217/0063* (2013.01); *H03K 2217/0072* (2013.01)

(58) Field of Classification Search
CPC ..... H03K 17/08122; H03K 2217/0063; H03K 2217/0072; H03K 17/567; H03K 17/6871; H03K 2217/0081
See application file for complete search history.

(56) References Cited

U.S. PATENT DOCUMENTS

| | | | |
|---|---|---|---|
| 7,088,151 | B1 | 8/2006 | Dequina et al. |
| 7,639,061 | B2 | 12/2009 | Sugiyama et al. |
| 9,729,150 | B2 | 8/2017 | Ishimatsu et al. |
| 10,763,664 | B2 | 9/2020 | Jordanger et al. |
| 11,569,809 | B2 | 1/2023 | Fujii et al. |
| 2002/0172056 | A1 | 11/2002 | Riggio et al. |
| 2012/0146613 | A1 | 6/2012 | Hamanaka et al. |

(Continued)

FOREIGN PATENT DOCUMENTS

| | | | |
|---|---|---|---|
| JP | 2012-130133 | A | 7/2012 |
| JP | 2013-229654 | A | 11/2013 |

(Continued)

OTHER PUBLICATIONS

Office Action issued in Japanese Application No. 2023-107034, dated Sep. 8, 2026 in 8 pages.

*Primary Examiner* — Metasebia T Retebo
(74) *Attorney, Agent, or Firm* — Knobbe, Martens, Olson & Bear, LLP

(57) ABSTRACT

According to one embodiment, a semiconductor device includes a first transistor, a first power supply circuit, a first circuit and a second circuit. The first transistor has a gate-source withstand voltage lower than an externally input power supply voltage. The first power supply circuit is configured to output a first voltage lower than the externally input power supply voltage. The first circuit is configured to drive a gate of the first transistor using the first voltage as a power supply. The second circuit is configured to supply a first current to the gate of the first transistor from a power supply voltage node to which the externally input power supply voltage is supplied.

19 Claims, 16 Drawing Sheets

(56) References Cited

U.S. PATENT DOCUMENTS

| | | | | |
|---|---|---|---|---|
| 2013/0009671 | A1 | 1/2013 | Suzuki et al. | |
| 2014/0253184 | A1 | 9/2014 | Yamauchi et al. | |
| 2022/0011799 | A1* | 1/2022 | Nagata | H03F 3/45179 |

FOREIGN PATENT DOCUMENTS

| | | | |
|---|---|---|---|
| JP | 5385341 | B2 | 1/2014 |
| JP | 2014-050179 | A | 3/2014 |
| JP | 2014-176228 | A | 9/2014 |
| JP | 5794195 | B2 | 10/2015 |
| JP | 2016-046935 | A | 4/2016 |
| JP | 2019-071769 | A | 5/2019 |
| JP | 6744935 | B2 | 8/2020 |
| JP | 2021-528946 | A | 10/2021 |
| JP | 2022-15509 | A | 1/2022 |
| JP | 2022-117063 | A | 8/2022 |

* cited by examiner

SEMICONDUCTOR DEVICE

CROSS-REFERENCE TO RELATED APPLICATIONS

This application is based upon and claims the benefit of priority from Japanese Patent Application No. 2023-107034, filed Jun. 29, 2023, the entire contents of which are incorporated herein by reference.

FIELD

Embodiments described herein relate generally to a semiconductor device.

BACKGROUND

A gate driver for driving a gate of a voltage-controlled type transistor, for example, a MOS field-effect transistor or an insulated gate bipolar transistor, is known.

For example, an output device having a gate withstand voltage lower than a power supply voltage (for example, 15 V to 40 V) requires an internal power source circuit (low drop out, LDO) of a low voltage (for example, 5 V or 3 V). Since it is not possible to directly apply a power supply voltage to a gate of an output device, it is necessary in most cases to apply a driving current to the gate of the output device through an internal power source circuit having a voltage equal to or lower than a gate withstand voltage, and a driving current to be applied to the gate is dependent on the capability of the internal power supply circuit.

In a gate driver device (output device) for driving an external device at a single-function and high-speed, the terminal of the output side is constituted by a power source terminal, a ground terminal, and a driver output terminal in most cases, and an external capacity cannot be therefore added.

In this case, in order to secure an instantaneous driving current for a transistor (predriver) of a previous stage required for high-rate driving of an output device, it is necessary to increase a capacity (in other words, add an internal capacity) that is provided at the output of the internal power supply circuit, which serves as a power supply to the predriver. For this reason, the bloated area of the internal power supply circuit and the high-rate driving is in a tradeoff, which causes an increase in a chip area.

An output device with a low gate withstand voltage has a high current driving capability, and is suitable for an "on" operation and an "off" operation with a large current. It is however necessary to apply a driving current to a gate of an output device through an internal power supply circuit having a voltage equal to or lower than a gate withstand voltage, and the need to make the size of the internal power supply circuit smaller than a required chip size leads to a problem wherein the current driving capability of the output device cannot be fully realized and a slew rate cannot be shortened, in other words, cannot be improved.

DETAILED DESCRIPTION

Figure 1:
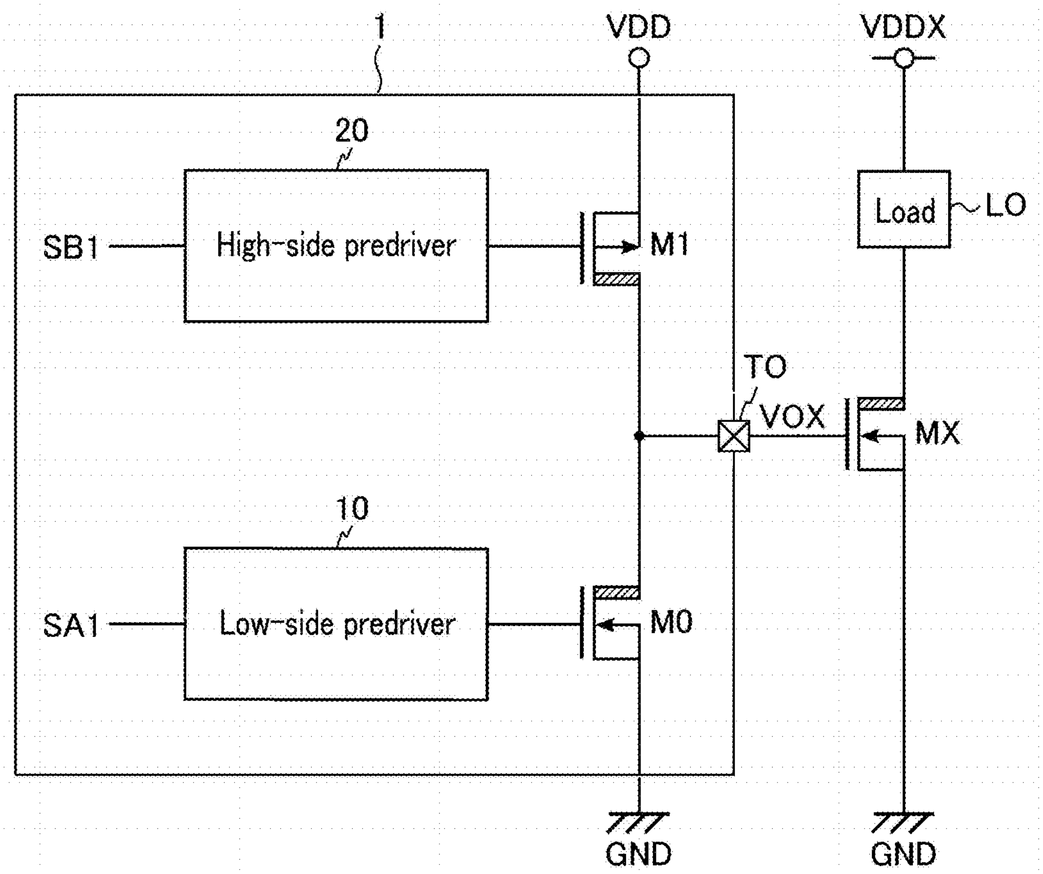
FIG. 1 is a circuit diagram showing an overall configuration of a semiconductor device according to a first embodiment.

In general, according to one embodiment, a semiconductor device includes a first transistor having a gate-source withstand voltage lower than an externally input power supply voltage; a first power supply circuit configured to output a first voltage lower than the externally input power supply voltage; a first circuit configured to drive a gate of the first transistor using the first voltage as a power supply; and a second circuit configured to supply a first current to the gate of the first transistor from a power supply voltage node to which the externally input power supply voltage is supplied.

Hereinafter, embodiments will be described with reference to the drawings. In the descriptions below, constituent elements having the same functions and configurations will be denoted by the same reference symbols. Each of the following embodiments is shown to present an example of a device and a method for carrying out the technical concept of the embodiment, and it is to be understood that the materials, the shapes, the structures, the arrangements, and the like of the constituent components are not limited to those shown below.

Each of the function blocks in the embodiments can be implemented in the form of hardware, software, or a combination thereof. It is not always necessary to distinguish the function blocks in the examples described hereinafter. For example, some of the functions may be implemented by a function block other than the exemplary function blocks. In addition, the exemplary function blocks may be further divided into function sub-blocks.

The semiconductor device according to an embodiment includes a gate driver (or gate driving circuit) for driving a gate of a voltage-controlled transistor, for example a metal oxide semiconductor field-effect transistor (MOSFET) or an insulated gate bipolar transistor (IGBT). The gate driver is a circuit for controlling a gate voltage (namely a gate-source voltage) of a transistor which is a target for driving, and switching between an on state and an off state in a transistor. The output circuit part of the gate driver, which is a characteristic feature of the present invention, will be mainly described hereinafter. Although the input circuit part, the insulating circuit part, the output control part, and the protective circuit part will not be described, the description is on the assumption that these parts are included in the gate driver. The drawings illustrate parts having technical features.

1. First Embodiment

A semiconductor device according to a first embodiment is described. The first embodiment illustrates an example in which paths are provided for letting a current flow from a node supplied with a power supply voltage VDD to a gate of a transistor constituting a driver and from a gate of a transistor constituting a driver to a node supplied with a ground voltage GND. The power supply voltage VDD is a power supply voltage that is externally input into the semiconductor device. The ground voltage GND is a reference voltage that is externally input into the semiconductor device.

1.1 Configuration of Semiconductor Device

First, an overall configuration of a semiconductor device according to the first embodiment is described. FIG. 1 is a circuit diagram showing an overall configuration of a semiconductor device according to the first embodiment.

The semiconductor device 1 of the first embodiment includes a low-side driver M0, a high-side driver M1, a low-side predriver 10, and a high-side predriver 20 as minimum components, and includes at least three terminals, a power supply terminal, a ground terminal, and an output terminal. The power supply terminal is externally supplied with the power supply voltage VDD. The ground terminal is externally supplied with the ground voltage GND. The output terminal is a terminal for driving an external transistor.

The low-side predriver 10 drives the gate of the low-side driver M0. In other words, the low-side predriver 10 controls a gate-source voltage of the low-side driver M0. The high-side predriver 20 drives the gate of the high-side driver M1. In other words, the high-side predriver 20 controls a source-gate voltage of the high-side driver M1. The low-side driver M0 and the high-side driver M1 drive the gate of the transistor MX which is a target for driving. In other words, the low-side driver M0 and the high-side driver M1 control a gate-source voltage of the transistor MX which is a target for driving.

Although not shown, the semiconductor device 1 may have a DESAT as a protection function, an active mirror clamp, and a detection function such as heat generation, and terminals associated with the function. The description hereinafter applies to the other embodiments.

The low-side driver M0 includes a MOS field-effect transistor, for example. Specifically, the low-side driver M0 is an n-channel DMOS (double-diffused metal oxide semiconductor) field-effect transistor. The high-side driver M1 includes a MOS field-effect transistor, for example. Specifically, the high-side driver M1 is a p-channel DMOS field-effect transistor. The low-side driver M0 and the high-side driver M1 used herein are a transistor having a source-drain withstand voltage higher than the power supply voltage VDD and a source-gate withstand voltage lower than the power supply voltage VDD. The source-gate withstand voltage of each of the low-side driver M0 and the high-side driver M1 is lower than the source-drain withstand voltage. The details of the low-side predriver 10 and the high-side predriver 20 will be described later.

A control signal SA1 is input into the input terminal of the low-side predriver 10. The output terminal of the low-side predriver 10 is coupled to the gate of the low-side driver M0. A control signal SB1 is input into the input terminal of the high-side predriver 20. The output terminal of the high-side predriver 20 is coupled to the gate of the high-side driver M1.

The source of the low-side driver M0 is coupled to a node to which the ground voltage GND is supplied (the node will be referred to as a "ground voltage GND node" hereinafter). The voltage GND is 0 V, for example. The source of the high-side driver M1 is coupled to a node to which the power supply voltage VDD is supplied (the node will be referred to as a "power supply voltage VDD node" hereinafter). The power supply voltage is 20 V, for example. The drain of the low-side driver M0 and the drain of the high-side driver M1 are coupled to the output terminal TO.

An output voltage VOX that is output from the output terminal TO is output to the gate of an external transistor MX. The transistor MX includes a MOS field-effect transistor or an IGBT, for example. For example, a load LO is coupled to one end of the transistor MX. The load LO is supplied with a power supply voltage VDDX, which is a voltage differing from the power supply voltage VDD. The transistor MX is switched to an on state or an off state in accordance with the output voltage VOX. The supply of the power supply voltage VDDX to the load LO is thereby controlled.

Figure 2:
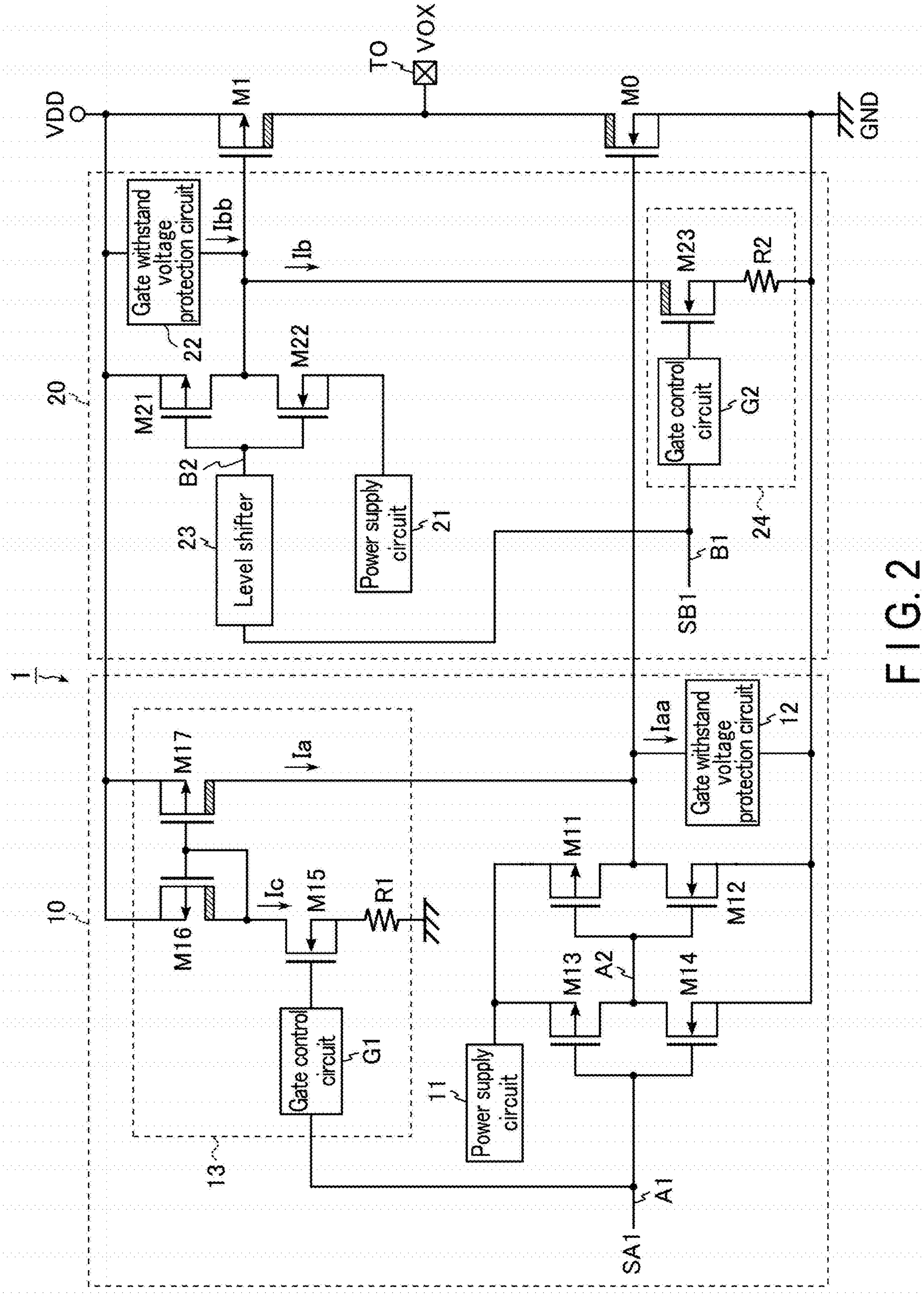
FIG. 2 is a circuit diagram showing a detailed configuration of the semiconductor device according to the first embodiment.

Next, a detailed configuration of the semiconductor device 1 according to the first embodiment is described. FIG. 2 is a circuit diagram showing a detailed configuration of the semiconductor device according to the first embodiment. FIG. 2 mainly shows the low-side predriver 10 and the high-side predriver 20 in detail.

The low-side predriver 10 includes transistors M11, M12, M13, and M14, a power supply circuit 11, a gate withstand voltage protection circuit 12, and a gate booster circuit 13.

The power supply circuit 11 supplies a voltage V1 as an internal power supply voltage in the semiconductor device 1. The voltage V1 is for example 5 V, univocally drives the low-side driver M0, and is equal to or lower than ½ of the power supply voltage VDD in most cases.

The gate withstand voltage protection circuit 12 restricts a voltage of a gate in such a manner that the gate-source voltage of the low-side driver M0 does not exceed the gate-source withstand voltage, so as to protect the low-side driver M0. Herein, suppose the gate-source withstand voltage of the low-side driver M0 is 7 V, for example. In this case, the gate-source withstand voltage is restricted so as not to exceed 5 V, with a leeway for 7 V left. If the voltage of the gate of the low-side driver M0 exceeds 5 V, the gate withstand voltage protection circuit 12 causes a current to flow from the gate of the low-side driver M0 to the ground voltage GND node so as to step down the voltage of the gate, so that the gate-source withstand voltage does not become higher than 5 V.

The gate booster circuit 13 supplies a current to the gate of the low-side driver M0 from the power supply voltage VDD node to boost the voltage of the gate of the low-side driver M0. The gate booster circuit 13 includes transistors M15, M16, and M17, a resistor element R1, and a gate control circuit G1.

The transistor M15 includes an n-channel MOS field-effect transistor, for example. Each of the transistors M16 and M17 includes a p-channel MOS field-effect transistor, for example. Specifically, each of the transistors M16 and M17 are a p-channel DMOS field-effect transistor. The transistors M16 and M17 constitute a current mirror circuit. For this reason, the current Ia flowing in the transistor M17 is almost the same as the current Ic flowing in the transistor M16. The resistor element R1 restricts the current Ic flowing in the transistor M15 and M16.

The gate control circuit G1 receives the control signal SA1, and outputs a pulse based on the control signal SA1 or a rectangular signal shorter than the control signal SA1 to the gate of the transistor M15.

Each of the transistors M11 and M13 includes a p-channel MOS field-effect transistor, for example. Each of the transistors M12 and M14 includes an n-channel MOS field-effect transistor, for example.

The high-side predriver 20 includes transistors M21 and M22, a power supply circuit 21, a gate withstand voltage protection circuit 22, a level shifter 23, and a gate step-down circuit 24.

The power supply circuit 21 supplies a voltage V2 as an internal power supply voltage in the semiconductor device 1. The voltage V2 is for example 15 V, which is a value obtained by subtracting a source-gate voltage of the high-side driver M1 to be controlled from the power supply voltage VDD, and the voltage is associated with driving with a voltage obtained.

The gate withstand voltage protection circuit 22 restricts a voltage of the gate in such a manner that the source-gate voltage of the high-side driver M1 does not exceed the source-gate withstand voltage, so as to protect the high-side driver M1. Herein, suppose the source-gate withstand voltage of the high-side driver M1 is 7 V, for example. In this case, the source-gate withstand voltage is restricted so as not to exceed 5 V, with a leeway for 7 V left. If the voltage of the gate becomes lower than 15 V, the gate withstand voltage protection circuit 22 causes a current to flow from the power supply voltage VDD node to the gate of the high-side driver M1 so as to boost the voltage of the gate of the high-side driver M1, so that the voltage of the gate of the high-side driver M1 does not become lower than 15 V.

The level shifter 23 converts a voltage level of the control signal SB1 to be input thereto, and outputs the converted voltage level. For example, the level shifter 23 outputs at 20 V if the control signal SB1 is 5 V, and outputs at 15 V if the control signal SB1 is 0 V.

The gate step-down circuit 24 supplies a current to the ground voltage GND node from the gate of the high-side driver M1 to step down the voltage of the gate of the high-side driver M1. The gate step-down circuit 24 includes a transistor M23, a resistor element R2, and a gate control circuit G2.

The transistor M23 includes an n-channel MOS field-effect transistor, for example. Specifically, the transistor M23 is an n-channel DMOS field-effect transistor. The resistor element R2 restricts the current Ib flowing in the transistor M23.

The gate control circuit G2 receives the control signal SB1, and outputs a pulse based on the control signal SB1 or a rectangular signal shorter than the control signal SB1 to the gate of the transistor M23.

The transistor M21 includes a p-channel MOS field effect transistor, for example. The transistor M22 includes an n-channel MOS field-effect transistor, for example.

Hereinafter, the circuit coupling of the semiconductor device 1 shown in FIG. 2 is described.

The control signal SA1 is input into the node A1. The node A1 is coupled to the gate of the transistor M13 and the gate of the transistor M14.

The drain of the transistor M13 is coupled to the drain of the transistor M14. The drains of the transistors M13 and M14 are coupled to the node A2. The node A2 is coupled to the gate of the transistor M11 and the gate of the transistor M12. The output terminal of the power supply circuit 11 is connected to the source of the transistor M13 and the source of the transistor M11.

The drain of the transistor M11 is coupled to the drain of the transistor M12. The drains of the transistors M11 and M12 are coupled to the gate of the low-side driver M0. The source of the transistor M14, the source of the transistor M12, and the source of the low-side driver M0 are coupled to the ground voltage GND node.

The gate withstand voltage protection circuit 12 is coupled between the gate of the low-side driver M0 and the ground voltage GND node.

The node A1 is coupled to the input terminal of the gate control circuit G1. The output terminal of the gate control circuit G1 is coupled to the gate of the transistor M15. The drain of the transistor M15 is coupled to the gate and the drain of the transistor M16 and the gate of the transistor M17. The source of the transistor M15 is coupled to the ground voltage GND node via the resistor element R1.

The drain of the transistor M17 is coupled to the gate of the low-side driver M0. The source of the transistor M16 and the source of the transistor M17 are coupled to the power supply voltage VDD node.

The control signal SB1 is input into the node B1. The node B1 is coupled to the input terminal of the level shifter 23. The output terminal of the level shifter 23 is coupled to the node B2. The node B2 is coupled to the gate of the transistor M21 and the gate of the transistor M22.

The drain of the transistor M21 is coupled to the drain of the transistor M22. The drains of the transistors M21 and M22 are coupled the gate of the high-side driver M1. The source of the transistor M22 is coupled to the output terminal of the power supply circuit 21.

The source of the transistor M21 and the source of the high-side driver M1 are coupled to the power supply voltage VDD node.

The gate withstand voltage protection circuit 22 is coupled between the gate of the high-side driver M1 and the power supply voltage VDD node.

The node B1 is coupled to the input terminal of the gate control circuit G2. The output terminal of the gate control circuit G2 is coupled to the gate of the transistor M23. The drain of the transistor M23 is coupled the gate of the high-side driver M1. The source of the transistor M23 is coupled to the ground voltage GND node via the resistor element R2.

The drain of the low-side driver M0 and the drain of the high-side driver M1 are coupled to the output terminal TO.

1.2. Operation of Semiconductor Device

Figure 3:
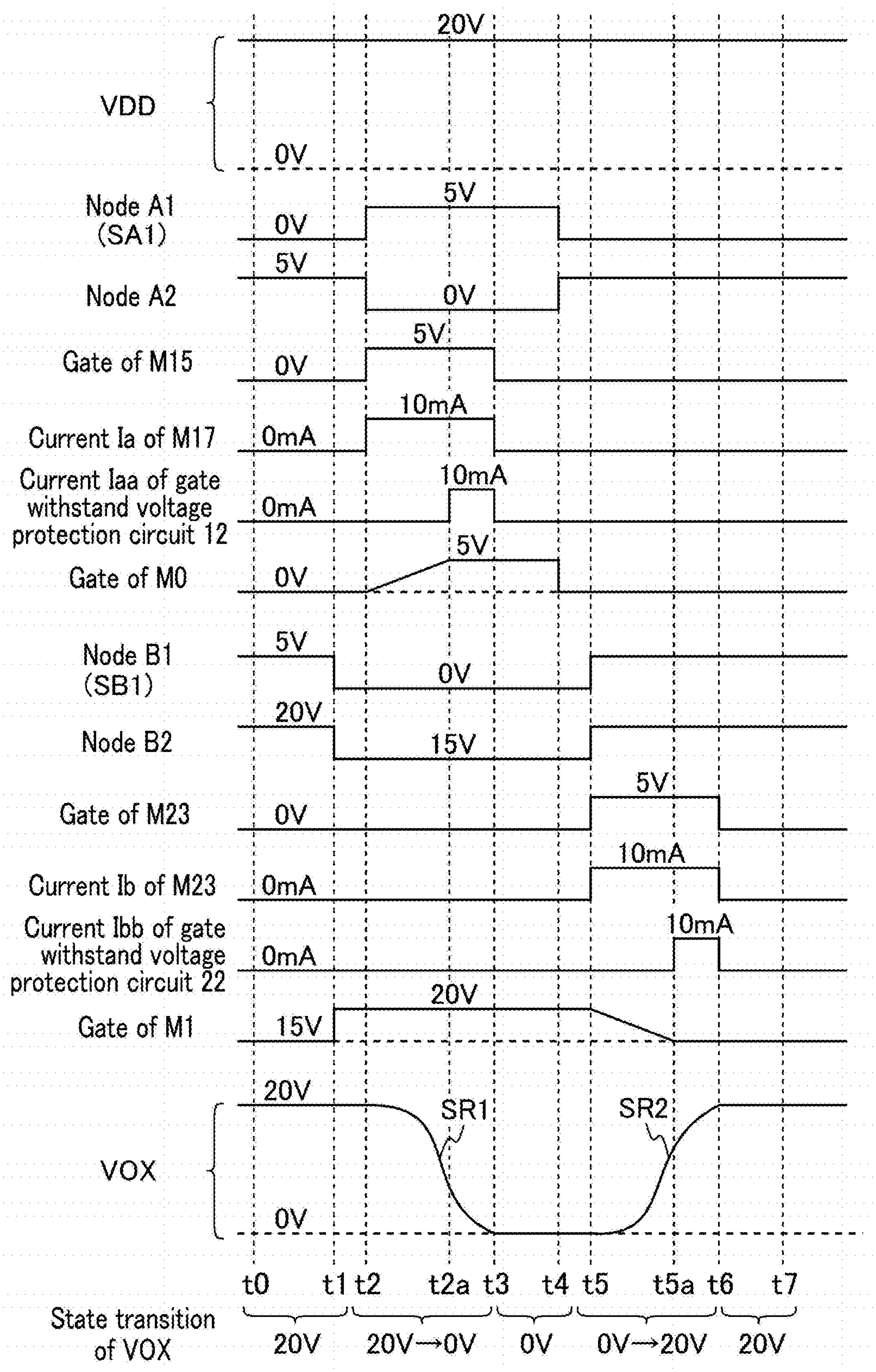
FIG. 3 is a timing chart showing an operation in the semiconductor device according to the first embodiment.

Next, an operation of the semiconductor device 1 according to the first embodiment is described. FIG. 3 is a timing chart showing an operation of the semiconductor device 1 of the first embodiment and illustrating a voltage and a current of each part in the semiconductor device 1.

The operations in the cases where the output voltage VOX that is output from the output terminal TO of the semiconductor device 1 changes (1) from 20 V to 0 V and (2) from 0 V to 20 V are described. The low-side driver M0 is supplied with the ground voltage GND (for example, 0 V), and the high-side driver M1 is supplied with the power supply voltage VDD (for example, 20 V). A control signal SA1 is input into the node A1, and a control signal SB1 is input into the node B1.

(1) Case where the Output Voltage VOX Changes from 20 V to 0 V

First, at time t0, 20 V is output from the output terminal TO as the output voltage VOX. At this time, the control signal SA1 that is input into the node A1 is set to "L" level (hereinafter, "L"), for example 0 V, and the output voltage of the gate control circuit G1 is set to 0 V. The control signal SB1 that is input into the node B1 is set to "H" level (hereinafter, "H"), for example 5 V, and the output voltage of the gate control circuit G2 is set to 0 V.

Next, at time t1, the control signal SB1 is set to "L". Then, the output voltage of the level shifter 23 is stepped down from 20 V to 15 V, and the voltage of node B2 is set to 15 V. For this reason, 15 V is supplied to the gate of the transistor M21. The source of the transistor M21 is supplied with 20 V from the power supply voltage VDD node. The transistor M21 thereby changes from an off state to an on state.

On the other hand, 15 V is supplied to the gate of the transistor M22, and 15 V is supplied from the power supply circuit 21 to the source of the transistor M22. For this reason, the transistor M22 changes from the on state to the off state.

If the transistor M21 is set to the on state and the transistor M22 is set to the off state, 20 V is supplied to the gate of the high-side driver M1. The source of the high-side driver M1 is supplied with 20 V. For this reason, the high-side driver M1 changes from the on state to the off state. The high-side driver M1 thereby stops the supply of 20 V to the output terminal TO.

Next, at time t2, the control signal SA1 is set to "H". Then, the voltage of the node A1 is set to 5 V. For this reason, 5 V is supplied to the gate of the transistor M13. The source of the transistor M13 is supplied with 5 V from the power supply circuit 11. For this reason, the transistor M13 changes from the on state to the off state.

On the other hand, 5 V is supplied to the gate of the transistor M14, and 0 V is supplied to the source of the transistor M14. For this reason, the transistor M14 changes from the off state to the on state. The voltage of the node A2 is thereby set to 0 V.

If the node A2 is set to 0 V, the gate of the transistor M11 is supplied with 0 V. The source of the transistor M11 is supplied with 5 V from the power supply circuit 11. For this reason, the transistor M11 changes from the off state to the on state.

On the other hand, 0 V is supplied to the gate of the transistor M12, and 0 V is supplied to the source of the transistor M12. For this reason, the transistor M12 changes from the on state to the off state.

If the transistor M11 is set to the on state and the transistor M12 is set to the off state, 5 V is supplied to the gate of the low-side driver M0 from the power supply circuit 11. The voltage of the gate of the low-side driver M0 thereby starts a transition from 0 V to 5 V. The source of the low-side driver M0 is supplied with 0 V. For this reason, if the voltage of the gate of the low-side driver M0 changes to 5 V, the low-side driver M0 changes from the off state to the on state. The low-side driver M0 thereby starts the supply of 0 V to the output terminal TO.

At time t2, the control signal SA1 is set to "H". Then, 5 V is output from the gate control circuit G1 to the gate of the transistor M15 for a duration of time shorter than a duration of time when the control signal SA1 is at "H". If 5 V is supplied to the gate of the transistor M15, the transistor M15 changes from the off state to the on state. A current Ic thereby flows in a current path of the transistor M15. The current Ic is for example 10 mA.

Herein, the transistor M16 and the transistor M17 constitute a current mirror circuit. For this reason, a current value of the current Ia flowing in a current path of the transistor M17 becomes the same as the current value of the current Ic. The current Ia flows from the power supply voltage VDD node into the gate of the low-side driver M0 via the transistor M17, and charges the gate of the low-side driver M0. The current Ia serves as a booster current to boost the voltage of the gate of the low-side driver M0 from 0 V to 5 V. As a result, the voltage of the gate of the low-side driver M0 is rapidly boosted from 0 V to 5 V.

By the above-described operation, at time t3, 0 V is output from the output terminal TO as the output voltage VOX. As described above, the current Ia flowing from the power supply voltage VDD node into the gate of the low-side driver M0 rapidly boosts the voltage of the gate of the low-side driver M0 from 0 V to 5 V. For this reason, the low-side driver M0 changes from the off state to the on state. Thus, as indicated by SR1 in FIG. 3, the output voltage VOX that is output from the output terminal TO rapidly decreases from 20 V to 0 V. In other words, the slew rate of the output voltage VOX can be improved.

As described above, the supply of 20 V from the high-side driver M1 to the output terminal TO is interrupted, and 0 V is supplied from the low-side driver M0 to the output terminal TO, and the output voltage VOX is thereby set to 0 V at time t3 to t4.

The gate withstand voltage protection circuit 12 is provided between the gate of the low-side driver M0 and the ground voltage GND node. The gate withstand voltage protection circuit 12 prevents the gate-source voltage of the low-side driver M0 from becoming higher than the gate-source withstand voltage as a consequence of the current Ia flowing into the low-side driver M0. The gate withstand voltage protection circuit 12 prevents the gate-source voltage of the low-side driver M0 from becoming higher than 5 V, for example.

If the current Ia flows from the power supply voltage VDD node into the gate of the low-side driver M0, the voltage of the gate of the low-side driver M0 is boosted. At a timing at which the voltage of the gate of the low-side driver M0 reaches 5 V, the gate withstand voltage protection circuit 12 starts an operation. For this reason, a current Iaa flows from the gate of the low-side driver M0 to the ground voltage GND node via the gate withstand voltage protection circuit 12, and the voltage of the gate of the low-side driver M0 is stepped down. The gate-source voltage of the low-side driver M0 is thereby restricted to 5 V or lower. To give more detail, a current Ia starts flowing from the power supply voltage VDD node to the gate of the low-side driver M0 at time t2. If the gate-source voltage of the low-side driver M0 reaches 5V at time t2*a*, which is earlier than time t3, the gate withstand voltage protection circuit 12 starts an operation, and the current Iaa starts flowing from the gate of the low-side driver M0 to the ground voltage GND node. Then, at time t3, the flow of the current Ia and the current Iaa is stopped. It is thereby possible to prevent destruction of the low-side driver M0 that can be caused by applying between a gate and a source a voltage higher than the gate-source withstand voltage. Setting time t3 so that a length of time during which the current Iaa flows is as short as possible is desirable.

The resistor element R1 is coupled between the source of the transistor M15 and the ground voltage GND node. The resistor element R1 adjusts the current Ic that flows in a current path of the transistor M15, when the transistor M15 is set to the on state. By adjusting of a current value of the current Ic by the resistor element R1, the current value of the current Ia is adjusted as a booster current. It is thereby possible to adjust a speed of increasing the gate-source voltage of the low-side driver M0 from 0 V to 5 V.

(2) Case where the Output Voltage VOX Changes from 0 V to 20 V

At time t3, 0 V is output from the output terminal TO as the output voltage VOX. At this time, the control signal SA1 that is input into the node A1 is set to "H", for example 5 V, and the output voltage of the gate control circuit G1 is set to 0 V. The control signal SB1 that is input into the node B1 is set to "L", for example 0 V, and the output voltage of the gate control circuit G2 is set to 0 V.

Next, at time t4, the control signal SA1 is set to "L". Then, the voltage of the node A1 is set to 0 V. For this reason, 0 V is supplied to the gate of the transistor M13. The source of the transistor M13 is supplied with 5 V from the power supply circuit 11. The transistor M13 thereby changes from the off state to the on state.

On the other hand, 0 V is supplied to the gate of the transistor M14, and 0 V is supplied to the source of the transistor M14. For this reason, the transistor M14 changes from the on state to the off state. The voltage of the node A2 is thereby set to 5 V.

If the node A2 is set to 5 V, the gate of the transistor M11 is supplied with 5 V. The source of the transistor M11 is supplied with 5 V from the power supply circuit 11. For this reason, the transistor M11 changes from the on state to the off state.

On the other hand, 5 V is supplied to the gate of the transistor M12, and 0 V is supplied to the source of the transistor M12. For this reason, the transistor M12 changes from the off state to the on state.

If the transistor M11 is set to the off state and the transistor M12 is set to the on state, the supply of 0 V to the gate of the low-side driver M0 commences. The voltage of the gate of the low-side driver M0 thereby starts a transition from 5 V to 0 V. The source of the low-side driver M0 is supplied with 0 V. For this reason, if the voltage of the gate of the low-side driver M0 changes to 0 V, the low-side driver M0 changes from the on state to the off state. The low-side driver M0 thereby stops the supply of 0 V to the output terminal TO.

Next, at time t5, the control signal SB1 is set to "H". Then, the output voltage of the level shifter 23 increases from 15 V to 20 V, and the voltage of node B2 is set to 20 V. For this reason, the gate of the transistor M21 is supplied with 20 V. The source of the transistor M21 is supplied with 20 V. For this reason, the transistor M21 changes from the on state to the off state.

On the other hand, 20 V is supplied to the gate of the transistor M22, and 15 V is supplied from the power supply circuit 21 to the source of the transistor M22. For this reason, the transistor M22 changes from the off state to the on state.

If the transistor M21 is set to the off state and the transistor M22 is set to the on state, the supply of 15 V to the gate of the high-side driver M1 from the power supply circuit 21 commences. The voltage of the gate of the high-side driver M1 thereby starts a transition from 20 V to 15 V. The source of the high-side driver M1 is supplied with 20 V. For this reason, if the voltage of the gate of the high-side driver M1 changes to 15 V, the high-side driver M1 changes from the off state to the on state. The high-side driver M1 thereby starts the supply of 20 V to the output terminal TO.

At time t5, the control signal SB1 is set to "H". Then, 5 V is output from the gate control circuit G2 to the gate of the transistor M23 during a duration of time in which the control signal SB1 is shorter than the "H" duration of time. If 5 V is supplied to the gate of the transistor M23, the transistor M23 changes from the off state to the on state. A current Ib thereby flows in a current path of the transistor M23. The current Ib is for example 10 mA.

The current Ib is drawn into the ground voltage GND node from the gate of the high-side driver M1 via the transistor M23, so that the voltage of the gate of the high-side driver M1 is stepped down. As a result, the voltage of the gate of the high-side driver M1 is rapidly stepped down to 15 V from 20 V.

By the above-described operation, at time t6, 20 V is output from the output terminal TO as the output voltage VOX. As described above, the current Ib flowing from the high-side driver M1 to the ground voltage GND node rapidly steps down the voltage of the gate of the high-side driver M1 from 20 V to 15 V. For this reason, the high-side driver M1 changes from the off state to the on state. Thus, as indicated by SR2 in FIG. 3, the output voltage VOX that is output from the output terminal TO is rapidly boosted from 0 V to 20 V. In other words, the slew rate of the output voltage VOX can be improved.

As described above, at time t6 to t7, the output voltage VOX is thus set to 20 V as a result of interruption of the supply of 0 V from the low-side driver M0 to the output terminal TO and a supply of 20 V from the high-side driver M1 to the output terminal TO.

The gate withstand voltage protection circuit 22 is provided between the power supply voltage VDD node and the gate of the high-side driver M1. The gate withstand voltage protection circuit 22 prevents the source-gate voltage of the high-side driver M1 from becoming higher than the source-gate withstand voltage as a consequence of the current Ib flowing into the high-side driver M1. The gate withstand voltage protection circuit 22 prevents the gate voltage of the high-side driver M1 from becoming lower than 15 V, for example.

If the current Ib is drawn into the ground voltage GND node from the gate of the high-side driver M1, the voltage of the gate of the high-side driver M1 decreases. At a timing at which the voltage of the high-side driver M1 reaches 15 V, the gate withstand voltage protection circuit 22 starts an operation. For this reason, the current Ibb flows into the gate of the high-side driver M1 from the power supply voltage VDD node via the gate withstand voltage protection circuit 22 and thereby boosts the voltage of the gate of the high-side driver M1. The voltage of the gate of the high-side driver M1 is thereby restricted to 15 V or higher. To give more detail, the current Ib starts flowing from the gate of the high-side driver M1 to the ground voltage GND node at time t5. If the voltage of the gate of the high-side driver M1 decreases to 15 V at time t5*a*, which precedes time t6, the gate withstand voltage protection circuit 22 starts an operation, and the current Ibb starts flowing from the power supply voltage VDD node to the gate of the high-side driver M1. Then, at time t6, the flow of the current Ib and the current Ibb is stopped. As a result, the gate voltage decreases, and it is thereby possible to prevent the destruction of the high-side driver M1 that can be caused by the source-gate voltage becoming higher than source-gate withstand voltage. It is desirable to set a duration of time during which the current Ibb flows to be as short as possible.

The resistor element R2 is coupled between the source of the transistor M23 and the ground voltage GND node. The resistor element R2 adjusts the current Ib that flows in a current path of the transistor M23, when the transistor M23 is set to the on state. It is possible to adjust the speed of the voltage of the gate of the high-side driver M1 dropping from 20 V to 15 V by adjusting the current value of the current Ib with the resistor element R2.

In the operation according to the first embodiment, a deadtime is provided after the high-side driver M1 is set to the off state and before the low-side driver M0 starts a transition from the off state to the on state. For example, at time t1, the voltage of the gate of the high-side driver M1 is set to 20 V, and the high-side driver M1 is set to the off state. Thereafter, at time t2, the transition of the voltage of the gate of the low-side driver M0 from 0 V to 5 V is started, and the transition of the low-side driver M0 from the off state to the on state is started.

Similarly, a deadtime is provided after the low-side driver M0 is set to the off state and before the high-side driver M1 starts a transition from the off state to the on state. For example, at time t4, the voltage of the gate of the low-side driver M0 is set to 0 V, and the high-side driver M0 is set to the off state. Thereafter, at time t5, the transition of the voltage of the gate of the high-side driver M1 from 20 V to 15 V is started, and the transition of the high-side driver M1 from the off state to the on state is started.

Thus, a malfunction, such as a short-circuit between the power supply voltage VDD and the ground voltage GND, is avoided by providing a duration of time during which both the high-side driver M1 and the low-side driver M0 are in the off state when the on state of the high-side driver M1 and the low-side driver M0 is switched.

1.3 Modifications of Semiconductor Device

Next, modifications of the semiconductor device according to the first embodiment are described.

In the semiconductor device 1 shown in FIG. 1, the control signals SA1 and SB1 are directly input as an electric signal to the low-side predriver 10 and the high-side predriver 20 respectively. It is also possible to provide a transmit circuit and a receive circuit that are electrically insulated from each other in the input stages of the low-side predriver 10 and the high-side predriver 20 so that a signal is transmitted from the transmit circuit to the receive circuit. Hereinafter, Modification 1 wherein the semiconductor device includes a transmit circuit and a receive circuit is described.

Figure 4:
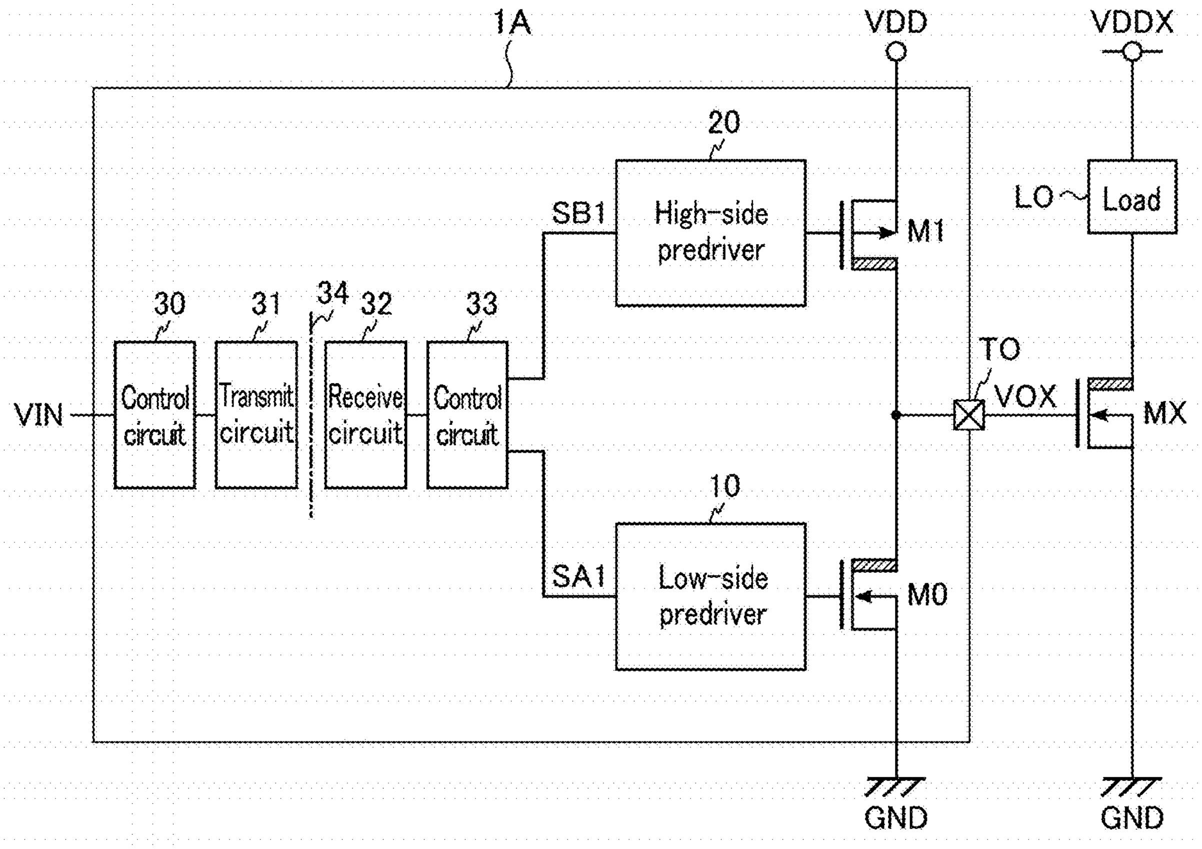
FIG. 4 is a circuit diagram showing a configuration of Modification 1 of the semiconductor device according to the first embodiment.

FIG. 4 is a circuit diagram showing a configuration of Modification 1 of the first embodiment. The semiconductor device 1A includes a control circuit 30, a transmit circuit 31, a receive circuit 32, and a control circuit 33, provided in the input stages of the low-side predriver 10 and the high-side predriver 20. An insulating part 34, for example, is provided between the transmit circuit 31 and the receive circuit 32.

The power supplies for operating the control circuits 30 and 33, the transmit circuit 31, and the receive circuit 32, and terminals and couplings relating thereto are omitted. This applies to Modifications 2 to 4 described later.

The control circuit 30 receives an externally provided input signal VIN. The control circuit 30 generates a driving signal for driving the transmit circuit 31 based on the received input signal VIN, and outputs the generated driving signal to the transmit circuit 31. The transmit circuit 31 generates a signal based on the driving signal supplied from the control circuit 30, and transmits the generated signal to the receive circuit 32 via the insulating part 34. The receive circuit 32 generates a signal based on the signal transmitted from the transmit circuit 31, and outputs the generated signal to the control circuit 33.

The control circuit 33 generates control signals SA1 and SB1 based on signals supplied from the receive circuit 32. The control circuit 33 outputs the generated control signals SA1 and SB1 to the low-side predriver 10 and the high-side predriver 20, respectively.

The transmit circuit 31 and the receive circuit 32 are insulated by the insulating part 34, for example. The transmission of the signal from the transmit circuit 31 to the receive circuit 32 is achieved by a use of an optical signal, a magnetic signal, or an electric field signal, for example.

Hereinafter, Modifications 2 to 4 where an optical signal, a magnetic signal, and an electric field signal are respectively used to transmit signals from the transmit circuit 31 to the receive circuit 32 will be described.

Figure 5:
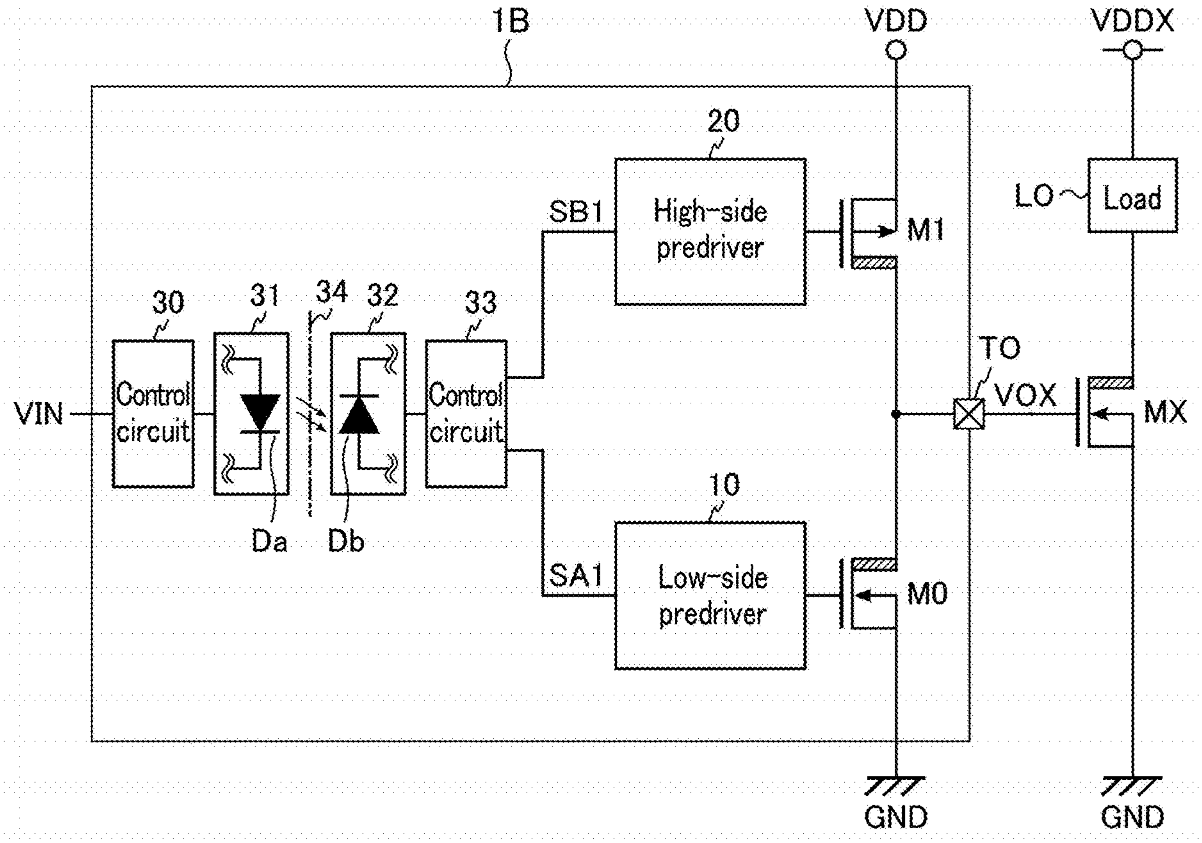
FIG. 5 is a circuit diagram showing a configuration of Modification 2 of the semiconductor device according to the first embodiment.

FIG. 5 is a circuit diagram showing a configuration of Modification 2 of the first embodiment. The semiconductor device 1B is an example where an optical signal is used to transmit a signal from the transmit circuit 31 to the receive circuit 32.

The transmit circuit 31 includes a light-emitting element, for example a light-emitting diode Da. The receive circuit 32 includes a light-receiving element, for example a photo diode Db.

The control circuit 30 generates a driving signal for driving the light-emitting diode Da in the transmit circuit 31 based on the received input signal VIN, and outputs the generated driving signal to the transmit circuit 31. The transmit circuit 31 causes the light-emitting diode Da to emit light using the driving signal generated in the control circuit 30. The light emitted from the light-emitting diode Da in the transmit circuit 31 is received by the photo diode Db in the receive circuit 32 via the insulating part 34. The photo diode Db converts the received light into an electric signal. The receive circuit 32 outputs an electric signal converted by the photo diode Db to the control circuit 33. The control circuit 33 generates control signals SA1 and SB1 based on electric signals supplied from the receive circuit 32. The control signals SA1 and SB1 generated by the control circuit 33 are input into the low-side predriver 10 and the high-side predriver 20, respectively.

The configuration of other parts and the operation in the semiconductor device 1B are the same as those of the first embodiment as illustrated in FIGS. 2 and 3.

Figure 6:
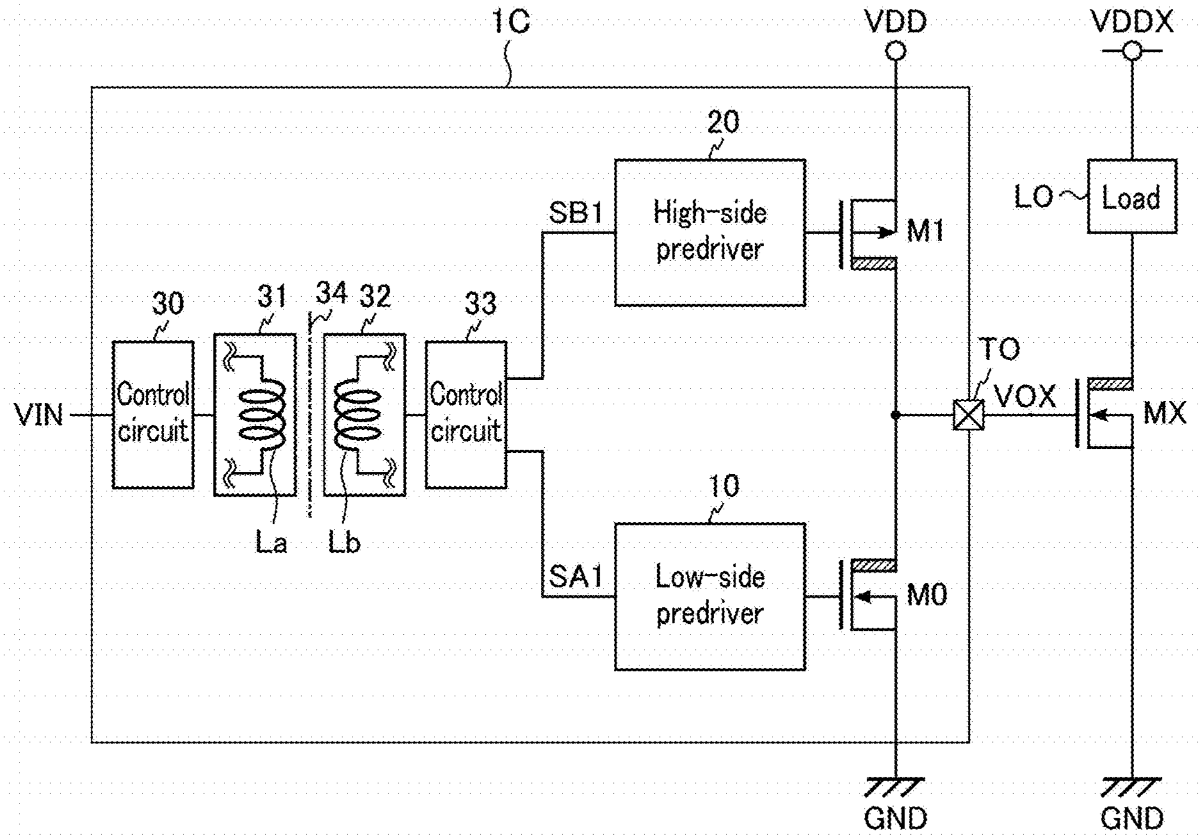
FIG. 6 is a circuit diagram showing a configuration of Modification 3 of the semiconductor device according to the first embodiment.

FIG. 6 is a circuit diagram showing a configuration of Modification 3 of the first embodiment. The semiconductor device 1C is an example where a magnetic signal is used for signal transmission from the transmit circuit 31 to the receive circuit 32.

The transmit circuit 31 includes an inductor La, for example. The receive circuit 32 includes an inductor Lb, for example.

The control circuit 30 generates a driving signal for driving the inductor La in the transmit circuit 31 based on the received input signal VIN, and outputs the generated driving signal to the transmit circuit 31. The transmit circuit 31 causes a current to flow in the inductor La using the driving signal generated in the control circuit 30. If a current flows in the inductor La in the transmit circuit 31, the magnetic field is generated in the vicinity of the inductor La. The magnetic field generated by the inductor La causes a change to a magnetic field in the vicinity of the inductor Lb in the receive circuit 32 via the insulating part 34. The inductor Lb generates a current by an electromotive force in accordance with the magnetic field generated by the inductor La. The receive circuit 32 outputs to the control circuit 33 an electric signal caused by the current generated in the inductor Lb. The control circuit 33 generates control signals SA1 and SB1 based on electric signals supplied from the receive circuit 32. The control signals SA1 and SB1 generated by the control circuit 33 are input into the low-side predriver 10 and the high-side predriver 20, respectively.

Although not shown, the transmit circuit 31 and the receive circuit 32 may transmit a differential signal, and in that case, a signal transmission is achieved by using two inductor (coil) pairs, in order to increase a resistance to noise (electro magnetic susceptibility, EMS), a resistance to electro magnetic interference (EMI), and common mode transient immunity (CMTI) characteristics.

Figure 7:
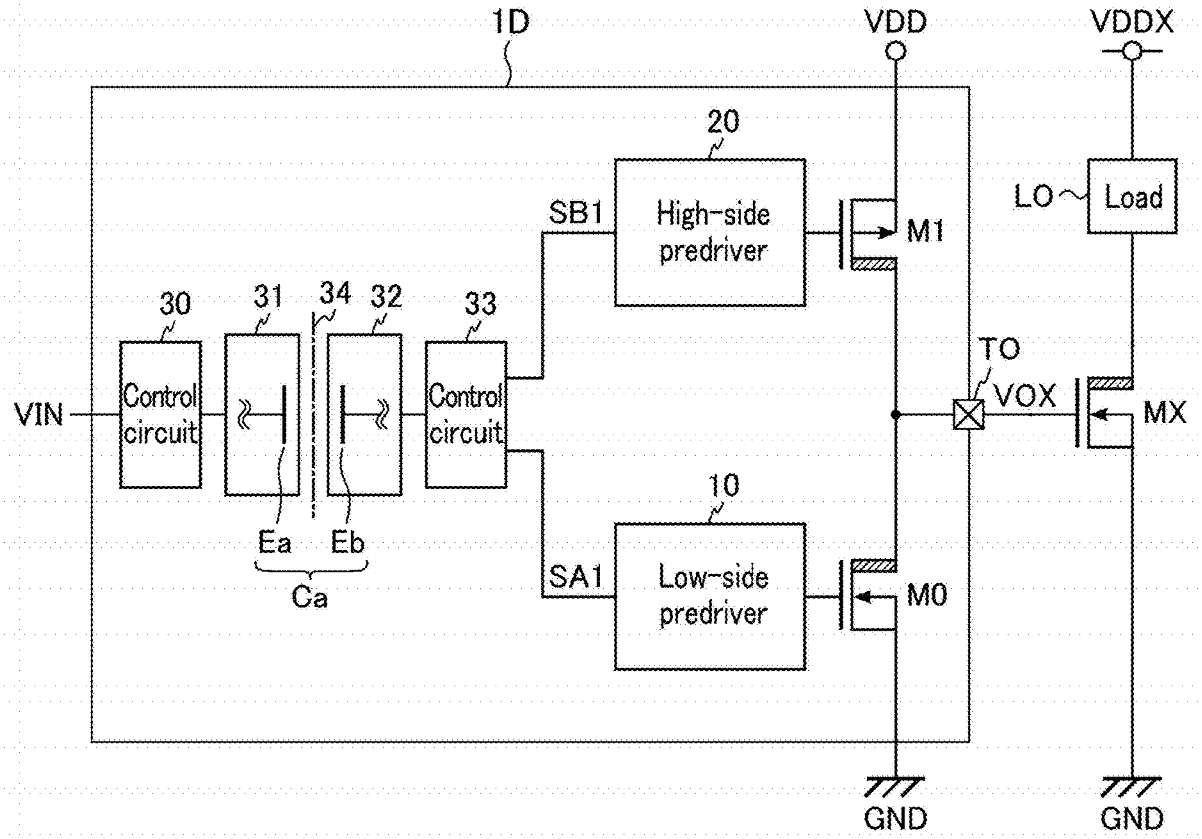
FIG. 7 is a circuit diagram showing a configuration of Modification 4 of the semiconductor device according to the first embodiment.

FIG. 7 is a circuit diagram showing a configuration of Modification 4 of the first embodiment. The semiconductor device 1D is an example where an electric field signal is used to transmit a signal from the transmit circuit 31 to the receive circuit 32.

The transmit circuit 31 includes a first electrode Ea, for example. The receive circuit 32 includes a second electrode Eb, for example. These first electrode Ea and second electrode Eb constitute a capacitor Ca.

The control circuit 30 generates a signal for applying a voltage to the first electrode Ea in the transmit circuit 31 based on the input signal VIN, and outputs the generated signal to the transmit circuit 31. The transmit circuit 31 applies a voltage to the first electrode Ea using the signal generated by the control circuit 30. If the voltage is applied to the first electrode Ea in the transmit circuit 31, the first electrode Ea is charged with an electrical charge. Then, the second electrode Eb in the receive circuit 32 is charged with an electrical charge via the insulating part 34, in accordance with the electrical charge that has charged the first electrode Ea. The receive circuit 32 outputs an electric signal caused by the charge that has charged the second electrode Eb to the control circuit 33. The control circuit 33 generates control signals SA1 and SB1 based on the electric signal supplied from the receive circuit 32. The control signals SA1 and SB1 generated by the control circuit 33 are input into the low-side predriver 10 and the high-side predriver 20, respectively.

Although not shown, in order to increase the resistance to noise (EMS, EMI) and CMTI characteristics, the transmit circuit 31 and the receive circuit 32 may transmit a differential signal, and in that case, a signal transmission is achieved by using two capacitor pairs.

The foregoing Modifications 1 to 4 each include the control circuit 30, and the input signal VIN is input into the transmit circuit 31 via the control circuit 30; however, there is a case where the control circuit 30 is not included and the input signal VIN is directly input into the transmit circuit 31.

In the semiconductor device 1 shown in FIG. 2, resistor elements R1 and R2 each having a fixed resistance value are used; however, a variable resistance element having a temperature dependency may be used instead of the resistance elements R1 and R2. Replacing the resistor elements R1 and R2 with variable resistance elements prevents degradation of a current driving capability, which is caused by an increase of the "on" resistances of the low-side driver M0 and the high-side driver M1 when the temperature of the semiconductor device 1E rises. Hereinafter, Modification 5 where variable resistor elements are included instead of the resistor elements R1 and R2 is described.

Figure 8:
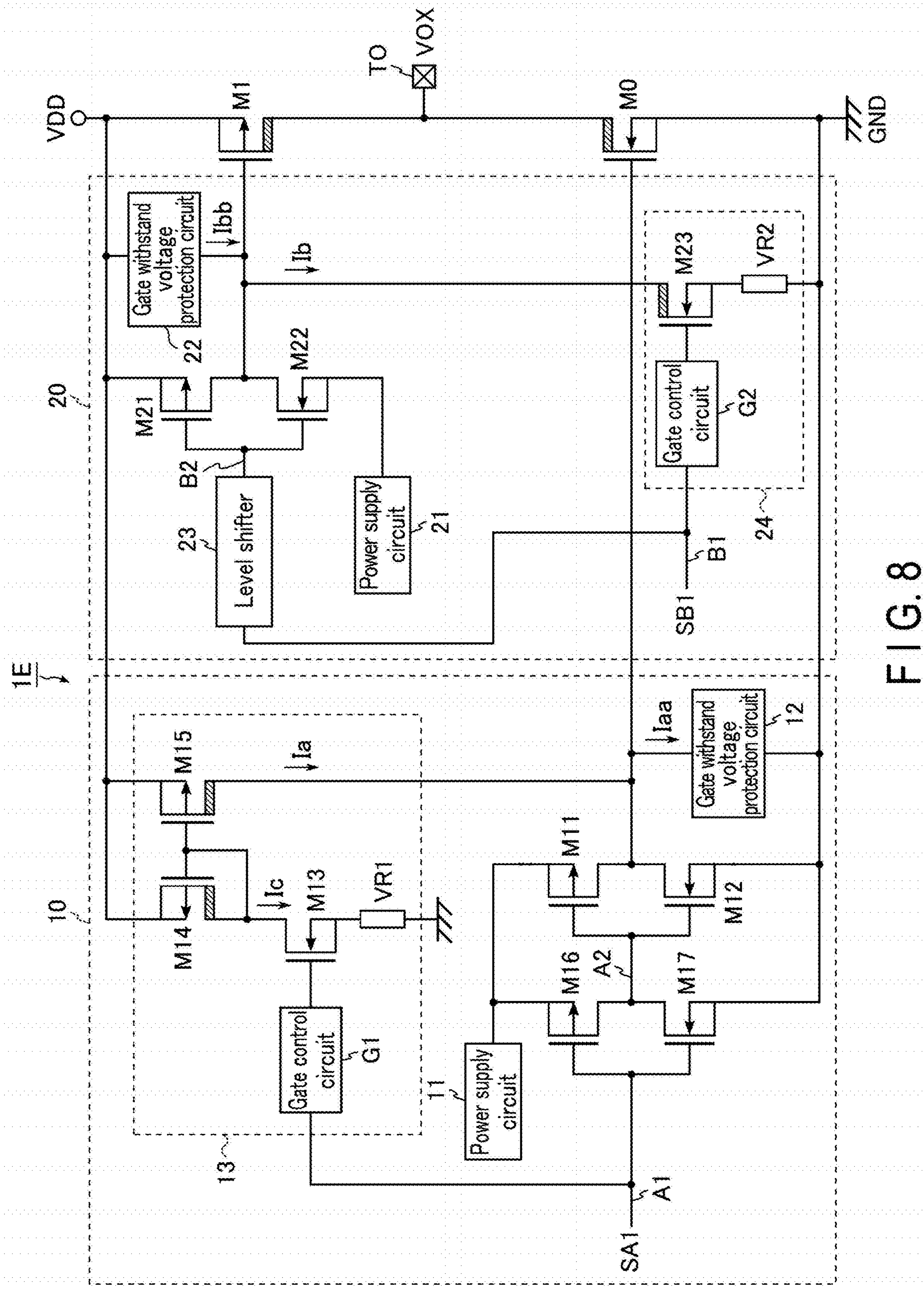
FIG. 8 is a circuit diagram showing a configuration of Modification 5 of the semiconductor device according to the first embodiment.

FIG. 8 is a circuit diagram showing a configuration of Modification 5 of the first embodiment. The semiconductor device 1E includes variable resistor elements VR1 and VR2 that have a temperature dependency instead of the resistor elements R1 and R2.

For example, if the temperature of the semiconductor device 1E rises, the "on" resistance of the low-side driver M0 increases, and the current driving capability is degraded. For this reason, increasing the current Ia rapidly changes the voltage of the gate of the low-side driver M0 from 0 V to 5 V. The degraded current driving capability of the low-side driver M0 is thus compensated. Similarly, increasing the current Ib rapidly changes the voltage of the gate of the high-side driver M1 from 20 V to 15 V. The degraded current driving capability of the high-side driver M1 is thus compensated.

Specifically, the variable resistor elements VR1 and VR2 have a temperature dependency, which means that a resistance value decreases as a temperature rises. If the temperature of the semiconductor device 1E rises, the resistance value of the variable resistor element VR1 decreases as the temperature of the semiconductor device 1E rises. If the resistance value of the variable resistor element VR1 decreases, the current value of the current Ic increases, as does the current value of the current Ia. It is thereby possible to rapidly boost the voltage of the gate of the low-side driver M0 from 0 V to 5 V to accelerate an operation of supplying 0 V by the low-side driver M0.

If the temperature of the semiconductor device 1E becomes high, the resistance value of the variable resistor element VR2 decreases as the temperature of the semiconductor device 1E rises. If the resistance value of the variable resistor element VR2 decreases, the current value of the current Ib increases. It is thereby possible to rapidly step down the voltage of the gate of the high-side driver M1 from 20 V to 15 V to accelerate an operation of the high-side driver M1 supplying 20 V.

Herein, the variable resistor elements VR1 and VR2 having a temperature dependency in which a resistance value decreases as a temperature rises are used, but a device or a circuit other than a resistance element may be used as long as it has a temperature dependency in which a resistance value decreases as a temperature rises. A circuit that increases a current value of the current Ic as a temperature rises may be used.

A diode may be provided between the transistor M11 for supplying a voltage V1, and the transistor M12 and the gate of the low-side driver M0. Another diode may be provided between the transistor M22 for supplying a voltage V2, and the transistor M21 and the gate of the high-side driver M1. The provision of the diode prevents a current from flowing from the gate of the low-side driver M0 to the power supply circuit 11. Alternatively, a current is prevented from flowing from the power supply circuit 21 to the gate of the high-side driver M1. Hereinafter, Modification 6 in which diodes are provided is described.

Figure 9:
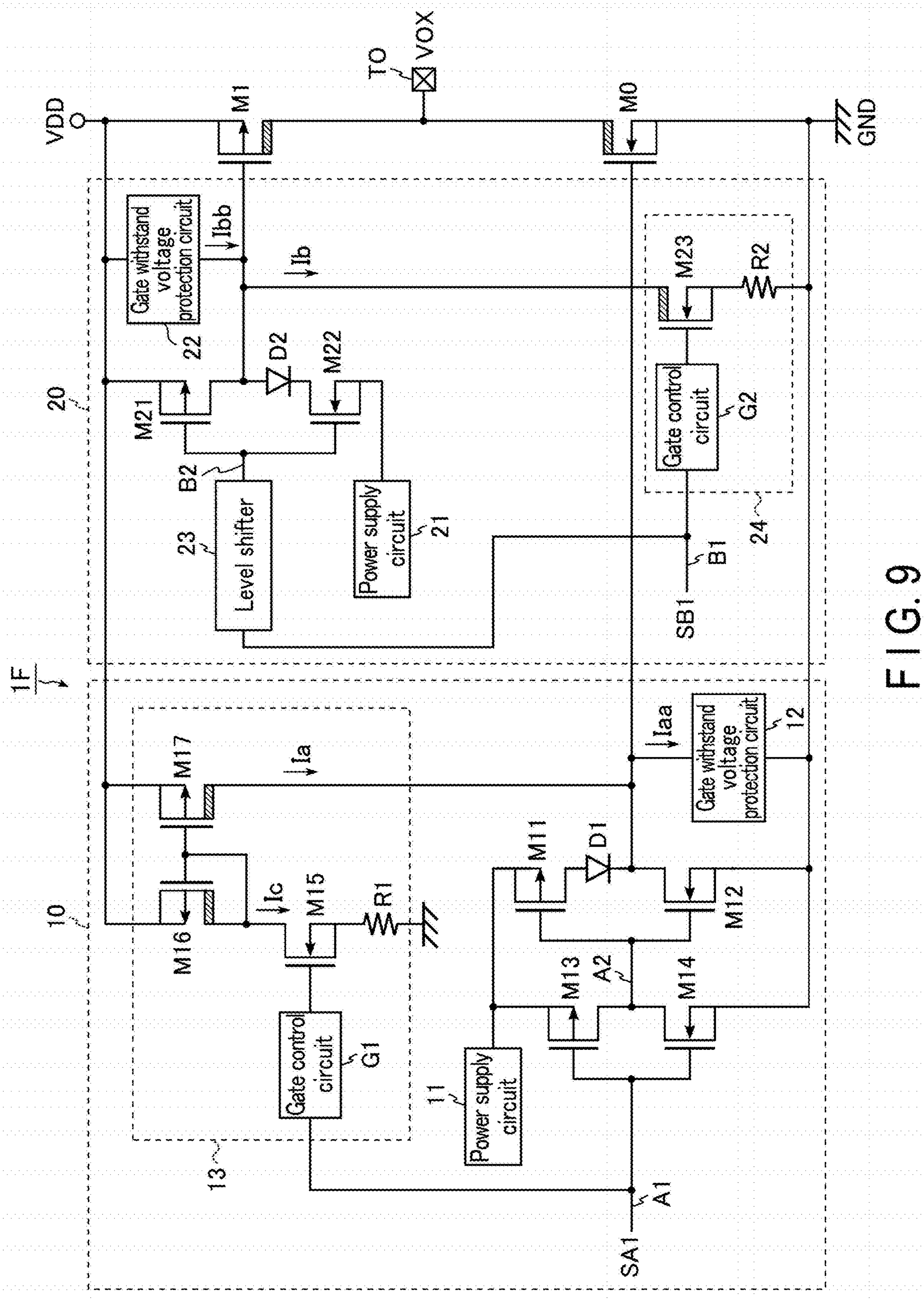
FIG. 9 is a circuit diagram showing a configuration of Modification 6 of the semiconductor device according to the first embodiment.

FIG. 9 is a circuit diagram showing a configuration of Modification 6 of the first embodiment. The semiconductor device 1F includes a diode D1 between the transistor M12, the gate of the low-side driver M0 and the transistor M11 for supplying a voltage V1 from the power supply circuit 11. Furthermore, the semiconductor device 1F includes a diode D2 between the transistor M21, the gate of the high-side driver M1 and the transistor M22 for supplying a voltage V2 from the power supply circuit 21.

The anode of the diode D1 is coupled to the drain of the transistor M11 and the cathode of the diode D1 is coupled to the drain of the transistor M12 and the gate of the low-side driver M0. The anode of the diode D2 is coupled to the drain of the transistor M21 and the gate of the high-side driver M1, and the cathode of the diode D2 is coupled to the drain of the transistor M22.

The provision of the diode D1 can prevent the current Ia from flowing from the transistor M17 back to the power supply circuit 11 via the transistor M11. Furthermore, the provision of the diode D2 can prevent a current from being drawn out of the power supply circuit 21 via the transistor M22, which is caused by a voltage drop at the gate of the transistor M1 due to a current drawn out by the transistor M23. Although not shown, an influence on the power supply circuit 11 (or the power supply circuit 21) may be reduced by restricting a current drawn out of the power supply circuit 11 (or the power supply circuit 21) by replacing the diode D1 (or D2) with a resistor or inserting a resistor in parallel to the diode D1 (or D2).

Although not shown, a resistor may be arranged in parallel to the diode D1 (or D2) so that a forward voltage VF of the diode D1 (or D2) can be canceled after a certain length of time.

1.4 Effects of First Embodiment

According to a semiconductor device that includes a gate driver of the first embodiment, it is possible to improve a slew rate of an output voltage.

Generally, the power supply voltage used in a gate driver on a semiconductor device is 4 V to 50 V, and 15 V to 50 V in most cases; however, the gate-source voltage of a MOS field-effect transistor, that is an output element of the gate driver, has a withstand voltage equal to or lower than a power supply voltage (e.g., 5 V). In this case, a power supply circuit is provided inside the semiconductor device so that the gate of the output element is driven. At this time, the output of this internal power supply circuit cannot be provided as a terminal in a gate driver having less externally connectible terminals, and a bypass capacitor therefore cannot be externally attached to the output of the internal power supply circuit. In such a case, it is necessary to drive the output element at a high rate using the internal power supply circuit. For this reason, it is necessary to increase the current driving capability of the internal power supply circuit, which may lead to an increase of a chip area, namely a semiconductor device area.

In contrast, according to the configuration of the first embodiment, by providing the gate booster circuit 13 that supplies the current Ia to the gate of the low-side driver M0 from the power supply voltage VDD node, which differs from the power supply circuit 11 provided in the semiconductor device as an internal power supply circuit, the voltage of the gate of the low-side driver M0 can be rapidly boosted from 0 V to 5 V. It is thereby possible to cause the low-side driver M0 to rapidly change from the off state to the on state and to improve a slew rate of an output voltage that is output from the low-side driver M0, without increasing the current driving capability of the power supply circuit 11, in other words, without increasing a chip area (semiconductor device area). By providing the gate step-down circuit 24 that causes the current Ib to flow from the gate of the high-side driver M1 to the ground voltage GND node, the voltage of the gate of the high-side driver M1 can be rapidly stepped down from 20 V to 15 V. It is thereby possible to cause the high-side driver M1 to rapidly change from the off state to the on state and to improve a slew rate of an output voltage that is output from the high-side driver M1, without increasing the current driving capability of the power supply circuit 21 provided in the semiconductor device as an internal power supply circuit, in other words, without increasing a chip area.

With the configuration of the first embodiment, through the provision of the gate withstand voltage protection circuit 12 between the gate of the low-side driver M0 and the ground voltage GND node, it is possible to restrict a voltage of the gate in such a manner that the gate-source voltage of the low-side driver M0 does not exceed the gate-source withstand voltage. It is thereby possible to prevent destruction of the low-side driver M0 that can be caused by the increase of the gate voltage and by the gate-source voltage becoming higher than gate-source withstand voltage. Through the provision of the gate withstand voltage protection circuit 22 between the power supply voltage VDD node and the gate of the high-side driver M1, it is possible to restrict a voltage of the gate in such a manner that the source-gate voltage of the high-side driver M1 does not exceed the source-gate withstand voltage. As a result, the gate voltage decreases, and it is thereby possible to prevent destruction of the high-side driver M1 caused by the source-gate voltage becoming higher than the source-gate withstand voltage.

According to the configuration of the first embodiment, through the provision of a device or a circuit for increasing the current Ia and Ib as the temperature of the semiconductor device rises, it is possible to improve a slew rate of the output voltage that is output from the low-side driver M0 and the high-side driver M1 even in the case where the temperature rises.

Problems to be solved and advantageous effects of the embodiment will be described below.

A circuit on the semiconductor device includes a low-side driver M0 having a gate withstand voltage lower than the power supply voltage VDD supplied to a power supply terminal and a power supply circuit 11 that outputs a voltage V1 equal to or higher than the gate withstand voltage of the low-side driver M0 using the power supply voltage VDD as a power supply. However, the output of the voltage V1 is not coupled to an externally connectible terminal; therefore, the semiconductor device cannot have an external coupling capacitor. If a slew rate of the output voltage VOX that is output from the output terminal TO needs to be enhanced, it is necessary to rapidly charge the gate capacitance of the low-side driver M0; on the other hand, providing a coupling capacitor inside a circuit in order to prevent the voltage V1 from dropping when the transistor M11 is turned to the on state increases a chip area of a semiconductor chip.

To avoid this, when the low-side driver M0 is set to the on state, a boost current is caused to flow in the gate of the low-side driver M0 during the time when the transistor M17 is in the on state, using a path for letting a current pass directly into the gate of the low-side driver M0 via the transistor M17 from the power supply voltage VDD, in parallel to the operation of turning the transistor M11 to the on state using the voltage V1 as a power supply. Thus, the charging of the gate capacitance of the low-side driver M0 is accelerated, without being dependent on a current driving capability of the power supply circuit 11 that supplies the voltage V1. Thus, in the present embodiment, a slew rate at the time when the output voltage VOX is changed from "H" (20 V) to "L" (0 V) is enhanced (for example, enhanced from 20 ns to 12 ns).

2. Second Embodiment

A semiconductor device according to the second embodiment is described. The second embodiment shows an example in which the voltage of the gate of transistors respectively constituting the low-side driver M0 and the high-side driver M1 is monitored to adjust the current Ia and the current Ib so that the gate-source voltage does not exceed the gate-source withstand voltage. The explanation of the second embodiment will focus mainly on the points that differ from the first embodiment.

2.1 Configuration of Semiconductor Device

The overall configuration of the semiconductor device according to the second embodiment is similar to that of the first embodiment shown in FIG. 1. Herein, the explanation of the overview configuration of the semiconductor device is omitted and the detailed configuration is explained.

Figure 10:
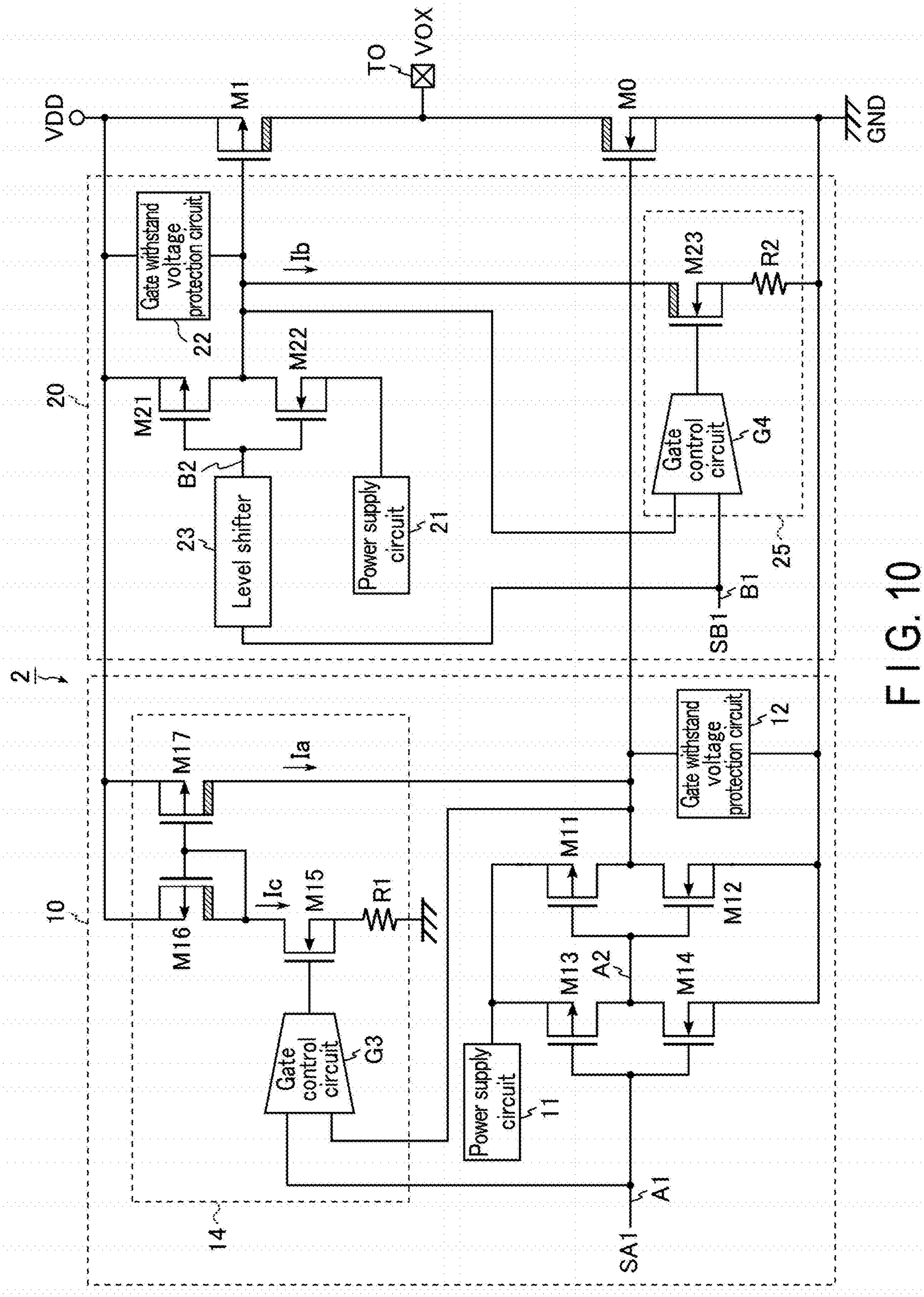
FIG. 10 is a circuit diagram showing a detailed configuration of a semiconductor device according to a second embodiment.

FIG. 10 is a circuit diagram showing a detailed configuration of the semiconductor device according to the second embodiment.

The semiconductor device 2 of the second embodiment includes a low-side driver M0, a high-side driver M1, a low-side predriver 10, and a high-side predriver 20.

The low-side predriver 10 includes transistors M11, M12, M13, and M14, a power supply circuit 11, a gate withstand voltage protection circuit 12, and a gate booster circuit 14.

The power supply circuit 11 supplies a voltage V1 as an internal power supply voltage in the semiconductor device 2. The voltage V1 is 5 V, for example.

The gate withstand voltage protection circuit 12 restricts a gate voltage in such a manner that the gate-source voltage of the low-side driver M0 does not exceed the gate-source withstand voltage, so as to protect the low-side driver M0. If the voltage of the gate of the low-side driver M0 exceeds 5 V, the gate withstand voltage protection circuit 12 causes a current to flow from the gate of the low-side driver M0 to the ground voltage GND node so as to step down the voltage of the gate, so that the gate voltage does not become higher than 5 V.

The gate booster circuit 14 supplies a current Ia to the gate of the low-side driver M0 from the power supply voltage VDD node to boost the voltage of the gate of the low-side driver M0 based on the control signal SA1 and the voltage of the gate of the low-side driver M0. The gate booster circuit 14 includes transistors M15, M16, and M17, a resistor element R1, and a gate control circuit G3.

The gate control circuit G3 monitors the voltage of the gate of the low-side driver M0, and if the gate-source voltage exceeds a preset threshold voltage, the gate control circuit G3 outputs a voltage that turns the transistor M15 to the off state to the gate of the transistor M15. For example, the gate control circuit G3 outputs a signal (e.g., 5 V) for setting the transistor M15 to the on state based on the voltage of the gate of the low-side driver M0 and the control signal SA1 if the gate-source voltage of the low-side driver M0 is lower than a preset threshold voltage (e.g., 5 V). On the other hand, the gate control circuit G3 outputs a signal (e.g., 0 V) for setting the transistor M15 to the off state if the gate-source voltage of the low-side driver M0 is equal to or greater than the preset threshold voltage (e.g., 5 V).

The transistors M16 and M17 constitute a current mirror circuit. For this reason, the current Ia flowing in the transistor M17 is almost the same as the current Ic flowing in the transistor M16. The resistor element R1 restricts the current Ic flowing in the transistors M15 and M16.

The high-side predriver 20 includes transistors M21 and M22, a power supply circuit 21, a gate withstand voltage protection circuit 22, a level shifter 23, and a gate step-down circuit 25.

The power supply circuit 21 supplies a voltage V2 as an internal power supply voltage in the semiconductor device 2. The voltage V2 is 15 V, for example.

The gate withstand voltage protection circuit 22 restricts a voltage of the gate in such a manner that the source-gate voltage of the high-side driver M1 does not exceed the source-gate withstand voltage, so as to protect the high-side driver M1. If the voltage of the gate becomes lower than 15 V, the gate withstand voltage protection circuit 22 causes a current to flow from the power supply voltage VDD node to the gate of the high-side driver M1 so as to boost the voltage of the gate of the high-side driver M1, so that the voltage of the gate of the high-side driver M1 does not become lower than 15 V.

The level shifter 23 converts a voltage level of the control signal SB1 to be input thereto, and outputs the converted voltage level. For example, the level shifter 23 outputs at 20 V if the control signal SB1 is 5 V, and outputs at 15 V if the control signal SB1 is 0 V.

The gate step-down circuit 25 causes the current Ib to flow from the gate of the high-side driver M1 to the ground voltage GND node based on the control signal SB1 and the voltage of the gate of the high-side driver M1 to lower the voltage of the gate of the high-side driver M1. The gate step-down circuit 25 includes a transistor M23, a resistor element R2, and a gate control circuit G4.

The gate control circuit G4 monitors the voltage of the gate of the high-side driver M1, and if the source-gate voltage exceeds a preset threshold, the gate control circuit G4 outputs a voltage that turns the transistor M23 to the off state to the gate of the transistor M23. For example, the gate control circuit G4 outputs a signal (e.g., 5 V) for setting the transistor M23 to the on state based on the voltage of the gate of the high-side driver M1 and the control signal SB1 (the voltage of the node B1) if the source-gate voltage of the high-side driver M1 is lower than a preset threshold voltage (e.g., 5 V). On the other hand, the gate control circuit G4 outputs a signal (e.g., 0 V) for setting the transistor M23 to the off state if the source-gate voltage of the high-side driver M1 is equal to or greater than the preset threshold voltage (e.g., 5 V). The resistor element R2 restricts the current Ib flowing in the transistor M23.

Hereinafter, the circuit coupling of the semiconductor device 2 shown in FIG. 10 is described.

The control signal SA1 is input into the node A1. The node A1 is coupled to the gate of the transistor M13 and the gate of the transistor M14.

The drain of the transistor M13 is coupled to the drain of the transistor M14. The drains of the transistors M13 and M14 are coupled to the node A2. The node A2 is coupled to the gate of the transistor M11 and the gate of the transistor M12. The output terminal of the power supply circuit 11 is connected to the source of the transistor M13 and the source of the transistor M11.

The drain of the transistor M11 is coupled to the drain of the transistor M12. The drains of the transistors M11 and M12 are coupled the gate of the low-side driver M0. The source of the transistor M14, the source of the transistor M12, and the source of the low-side driver M0 are coupled to the ground voltage GND node.

The gate withstand voltage protection circuit 12 is coupled between the gate of the low-side driver M0 and the ground voltage GND node.

The node A1 is coupled to the first input terminal of the gate control circuit G3. The gate of the low-side driver M0 is coupled to the second input terminal of the gate control circuit G3. The output terminal of the gate control circuit G3 is coupled to the gate of the transistor M15.

The drain of the transistor M15 is coupled to the gate and the drain of the transistor M16 and the gate of the transistor M17. The source of the transistor M15 is coupled to the ground voltage GND node via the resistor element R1.

The drain of the transistor M17 is coupled the gate of the low-side driver M0. The source of the transistor M16 and the source of the transistor M17 are coupled to the power supply voltage VDD node.

The control signal SB1 is input into the node B1. The node B1 is coupled to the input terminal of the level shifter 23. The output terminal of the level shifter 23 is coupled to the node B2. The node B2 is coupled to the gate of the transistor M21 and the gate of the transistor M22.

The drain of the transistor M21 is coupled to the drain of the transistor M22. The drains of the transistors M21 and M22 are coupled the gate of the high-side driver M1. The output terminal of the power supply circuit 21 is coupled to the source of the transistor M22.

The source of the transistor M21 and the source of the high-side driver M1 are coupled to the power supply voltage VDD node.

The gate withstand voltage protection circuit 22 is coupled between the gate of the high-side driver M1 and the power supply voltage VDD node.

The node B1 is coupled to the first input terminal of the gate control circuit G4. The gate of the high-side driver M1 is coupled to the second input terminal of the gate control circuit G4. The output terminal of the gate control circuit G4 is coupled to the gate of the transistor M23.

The drain of the transistor M23 is coupled the gate of the high-side driver M1. The source of the transistor M23 is coupled to the ground voltage GND node via the resistor element R2.

The drain of the low-side driver M0 and the drain of the high-side driver M1 are coupled to the output terminal TO.

Herein, an example where the gate withstand voltage protection circuits 12 and 22 are provided is given; however, the gate withstand voltage protection circuits 12 and 22 can be removed. By removing these circuits, it is possible to reduce power consumed by the circuits, downsize circuit areas, and achieve a low-cost design.

2.2. Operation in Second Embodiment

Figure 11:
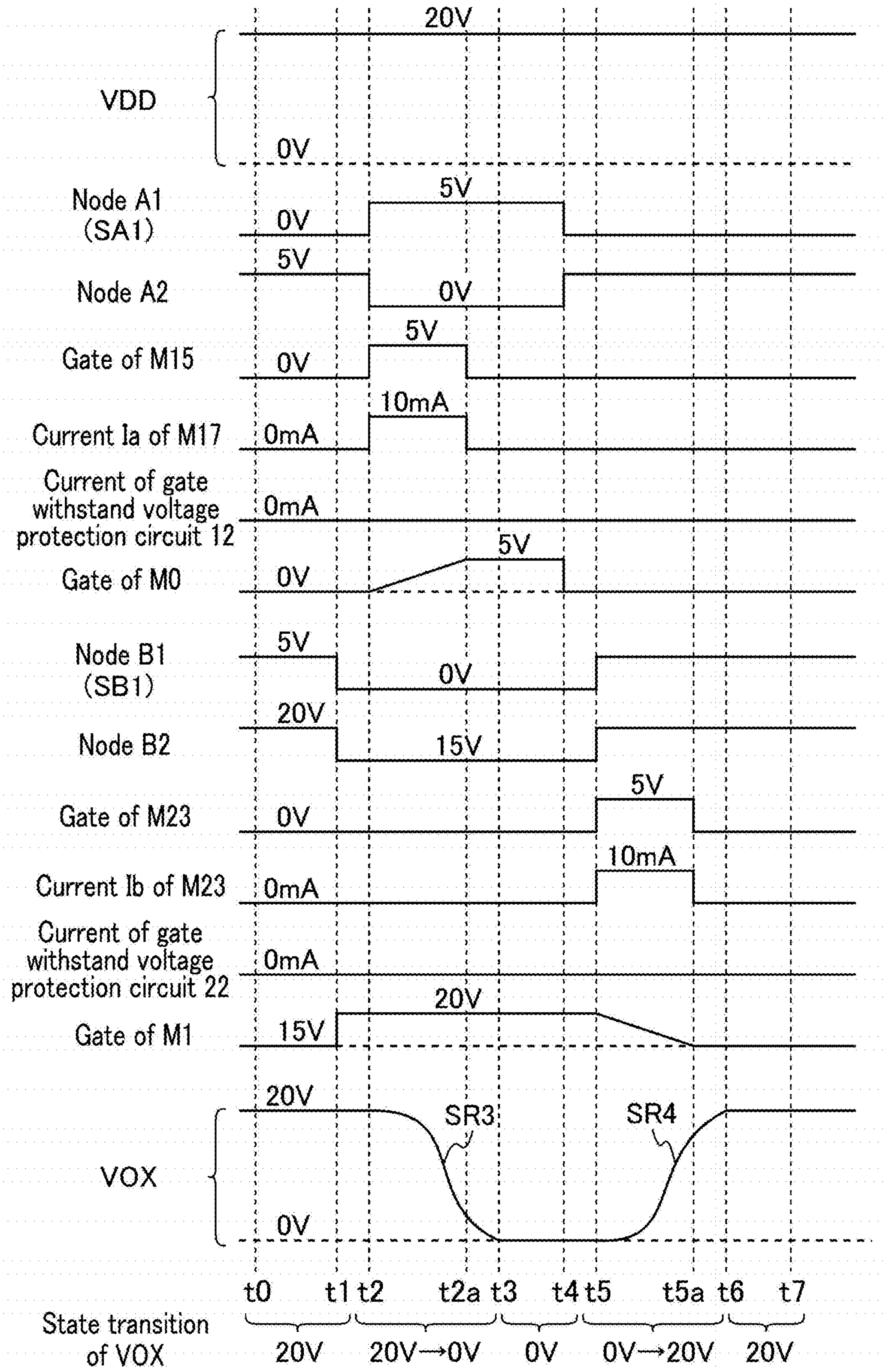
FIG. 11 is a timing chart showing an operation in the semiconductor device according to the second embodiment.

Next, an operation of the semiconductor device 2 according to the second embodiment is described. FIG. 11 is a timing chart showing an operation of the semiconductor device of the second embodiment and illustrating a voltage and a current of each part in the semiconductor device 2.

The operations in the cases where the output voltage VOX that is output from the output terminal TO of the semiconductor device 2 changes (1) from 20 V to 0 V and (2) from 0 V to 20 V are described. The low-side driver M0 is supplied with the ground voltage (for example, 0 V), and the high-side driver M1 is supplied with the power supply voltage (for example, 20 V). The control signal SA1 is input into the node A1, and the control signal SB1 is input into the node B1.

(1) Case where the Output Voltage VOX Changes from 20 V to 0 V

First, at time t0, 20 V is output from the output terminal TO as the output voltage VOX. At this time, the control signal SA1 that is input into the node A1 is set to "L", for example 0 V, and the output voltage of the gate control circuit G3 is set to 0 V. The control signal SB1 that is input into the node B1 is set to "H", for example 5 V, and the output voltage of the gate control circuit G4 is set to 0 V.

Next, at time t1, the control signal SB1 is set to "L". Then, the output voltage of the level shifter 23 is stepped down from 20 V to 15 V, and the voltage of node B2 is set to 15 V. For this reason, 15 V is supplied to the gate of the transistor M21. The source of the transistor M21 is supplied with 20 V from the power supply voltage VDD node. The transistor M21 thereby changes from the off state to the on state.

On the other hand, 15 V is supplied to the gate of the transistor M22, and 15 V is supplied from the power supply circuit 21 to the source of the transistor M22. For this reason, the transistor M22 changes from the on state to the off state.

If the transistor M21 is set to the on state and the transistor M22 is set to the off state, 20 V is supplied to the gate of the high-side driver M1. The source of the high-side driver M1 is supplied with 20 V. For this reason, the high-side driver M1 changes from the on state to the off state. The high-side driver M1 thereby stops the supply of 20 V to the output terminal TO.

Next, at time t2, the control signal SA1 is set to "H". Then, the voltage of the node A1 is set to 5 V. For this reason, 5 V is supplied to the gate of the transistor M13. The source of the transistor M13 is supplied with 5 V from the power supply circuit 11. For this reason, the transistor M13 changes from the on state to the off state.

On the other hand, 5 V is supplied to the gate of the transistor M14, and 0 V is supplied to the source of the transistor M14. For this reason, the transistor M14 changes from the off state to the on state. The voltage of the node A2 is thereby set to 0 V.

If the node A2 is set to 0 V, the gate of the transistor M11 is supplied with 0 V. The source of the transistor M11 is supplied with 5 V from the power supply circuit 11. For this reason, the transistor M11 changes from the off state to the on state.

On the other hand, 0 V is supplied to the gate of the transistor M12, and 0 V is supplied to the source of the transistor M12. For this reason, the transistor M12 changes from the on state to the off state.

If the transistor M11 is set to the on state and the transistor M12 is set to the off state, 5 V is supplied to the gate of the low-side driver M0 from the power supply circuit 11. The voltage of the gate of the low-side driver M0 thereby starts a transition from 0 V to 5 V. The source of the low-side driver M0 is supplied with 0 V. For this reason, if the voltage of the gate of the low-side driver M0 changes to 5V, the low-side driver M0 changes from the off state to the on state. The low-side driver M0 thereby starts the supply of 0 V to the output terminal TO.

At time t2, if the control signal SA1 is set to "H", 5 V is input into the first input terminal of the gate control circuit G3. The voltage of the gate of the low-side driver M0 is input into the second input terminal of the gate control circuit G3. Herein, the gate control circuit G3 outputs 5 V from the output terminal of the gate control circuit G3 if the gate-source voltage of the low-side driver M0 is lower than a preset threshold voltage (e.g., 5 V) and the control signal SA1 is "H". If the gate-source voltage of the low-side driver M0 is equal to or higher than the preset threshold voltage, the gate control circuit G3 outputs 0 V. Herein, since the gate-source voltage of the low-side driver M0 is lower than the preset threshold voltage, 5 V is supplied to the transistor M15 from the output terminal of the gate control circuit G3. For this reason, the transistor M15 changes from the off state to the on state. A current Ic thereby flows in a current path of the transistor M15. The current Ic is for example 10 mA.

Herein, the transistor M16 and the transistor M17 constitute a current mirror circuit. For this reason, a current value of the current Ia flowing in a current path of the transistor M17 becomes the same as the current value of the current Ic. The current Ia flows from the power supply voltage VDD node into the gate of the low-side driver M0 via the transistor M17, and charges the gate of the low-side driver M0. The current Ia serves as a booster current to boost the voltage of the gate of the low-side driver M0 from 0 V to 5 V. As a result, the voltage of the gate of the low-side driver M0 is rapidly boosted from 0 V to 5 V.

The gate control circuit G3 supplies 5 V to the gate of the transistor M15 until the voltage of the gate of the low-side driver M0 is boosted to 5 V. If the voltage of the gate of the low-side driver M0 reaches 5 V, the gate control circuit G3 stops the supply of 5 V.

By the above-described operation, at time t3, 0 V is output from the output terminal TO as the output voltage VOX. As described above, the current Ia flowing from the power supply voltage VDD node into the gate of the low-side driver M0 rapidly boosts the voltage of the gate of the low-side driver M0 from 0 V to 5 V. For this reason, the low-side driver M0 rapidly changes from the off state to the on state. Thus, as indicated by SR3 in FIG. 11, the output voltage VOX that is output from the output terminal TO rapidly decreases from 20 V to 0 V. In other words, the slew rate of the output voltage VOX can be improved.

As described above, the output voltage VOX is thus set to 0 V at time t3 to t4 as a result of an interruption of the supply of 20 V from the high-side driver M1 to the output terminal TO and the supply of 0 V from the low-side driver M0 to the output terminal TO.

In the present embodiment, the gate withstand voltage protection circuit 12 is provided in case the gate control circuit G3 cannot restrict the voltage of the gate of the low-side driver M0. The gate withstand voltage protection circuit 12 operates in a case where the gate-source voltage of the low-side driver M0 is restricted to be equal to or lower than the gate-source withstand voltage by the gate control circuit G3. The gate withstand voltage protection circuit 12 prevents the gate-source voltage of the low-side driver M0 from becoming higher than the gate-source withstand voltage as a consequence of the current Ia flowing into the low-side driver M0.

The gate control circuit G3 receives the voltage of the gate of the low-side driver M0 and the control signal SA1, and outputs a signal (e.g., 5 V) for setting the transistor M15 to the on state if the gate-source voltage of the low-side driver M0 is lower than a preset threshold voltage (e.g., 5 V) and the control signal SA1 is "H". Then, if the voltage of the gate of the low-side driver M0 reaches 5 V, the gate control circuit G3 outputs a signal (e.g., 0 V) for setting the transistor M15 to the off state. For this reason, the current Ia flows into the gate of the low-side driver M0 from the power supply voltage VDD node until the voltage of the gate of the low-side driver M0 reaches 5 V. If the voltage of the gate of the low-side driver M0 reaches 5 V, the current Ia flowing into the gate of the low-side driver M0 from the power supply voltage VDD node stops. For this reason, the gate-source voltage of the low-side driver M0 is thereby restricted to 5 V or lower. It is thereby possible to prevent destruction of the low-side driver M0 that can be caused by applying between a gate and a source a voltage higher than the gate-source withstand voltage.

The resistor element R1 is coupled between the source of the transistor M15 and the ground voltage GND node. The resistor element R1 adjusts the current Ic that flows in a current path of the transistor M15, when the transistor M15 is set to the on state. By adjusting a current value of the current Ic by the resistor element R1, the current value of the current Ia is adjusted as a booster current. It is thereby possible to adjust a speed of boosting the gate voltage of the low-side driver M0 from 0 V to 5 V.

(2) Case where the Output Voltage VOX Changes from 0 V to 20 V

At time t3, 0 V is output from the output terminal TO as the output voltage VOX. At this time, the control signal SA1 that is input into the node A1 is set to "H", for example 5 V, and the output voltage of the gate control circuit G3 is set to 0 V. The control signal B1 that is input into the node SB1 is set to "L", for example 0 V, and the output voltage of the gate control circuit G4 is set to 0 V.

Next, at time t4, the control signal SA1 is set to "L". Then, the voltage of the node A1 is set to 0 V. For this reason, 0 V is supplied to the gate of the transistor M13. The source of the transistor M13 is supplied with 5 V from the power supply circuit 11. The transistor M13 thereby changes from the off state to the on state.

On the other hand, 0 V is supplied to the gate of the transistor M14, and 0 V is supplied to the source of the transistor M14. For this reason, the transistor M14 changes from the on state to the off state. The voltage of the node A2 is thereby set to 5 V.

If the node A2 is set to 5 V, the gate of the transistor M11 is supplied with 5 V. The source of the transistor M11 is supplied with 5 V from the power supply circuit 11. For this reason, the transistor M11 changes from the on state to the off state.

On the other hand, 5 V is supplied to the gate of the transistor M12, and 0 V is supplied to the source of the transistor M12. For this reason, the transistor M12 changes from the off state to the on state.

If the transistor M11 is set to the off state and the transistor M12 is set to the on state, the supply of 0 V to the gate of the low-side driver M0 commences. The voltage of the gate of the low-side driver M0 thereby starts a transition from 5 V to 0 V. The source of the low-side driver M0 is supplied with 0 V. For this reason, if the voltage of the gate of the low-side driver M0 changes to 0 V, the low-side driver M0 changes from the on state to the off state. The low-side driver M0 thereby stops the supply of 0 V to the output terminal TO.

Next, at time t5, the control signal SB1 is set to "H". Then, the output voltage of the level shifter 23 increases from 15 V to 20 V, and the voltage of node B2 is set to 20 V. For this reason, the gate of the transistor M21 is supplied with 20 V.

The source of the transistor M21 is supplied with 20 V. For this reason, the transistor M21 changes from the on state to the off state.

On the other hand, 20 V is supplied to the gate of the transistor M22, and 15 V is supplied from the power supply circuit 21 to the source of the transistor M22. For this reason, the transistor M22 changes from the off state to the on state.

If the transistor M21 is set to the off state and the transistor M22 is set to the on state, 15 V is supplied to the gate of the high-side driver M1 from the power supply circuit 21. The voltage of the gate of the high-side driver M1 thereby starts a transition from 20 V to 15 V. The source of the high-side driver M1 is supplied with 20 V. For this reason, if the voltage of the gate of the high-side driver M1 changes to 15 V the high-side driver M1 changes from the off state to the on state. The high-side driver M1 thereby starts the supply of 20 V to the output terminal TO.

At time t5, if the control signal SB1 is set to "H", 5 V is input into the first input terminal of the gate control circuit G4. A voltage of the gate of the high-side driver M1 is input into the second input terminal of the gate control circuit G4. Herein, the gate control circuit G4 outputs 5 V from the output terminal if the source-gate voltage of the high-side driver M1 is lower than a preset threshold voltage (e.g., 5 V) and the control signal SB1 is "H". If the source-gate voltage of the high-side driver M1 is equal to or higher than a preset threshold voltage, the gate control circuit G4 outputs 0 V. Herein, since the source-gate voltage of the high-side driver M1 is lower than the preset threshold voltage, 5 V is supplied to the gate of the transistor M23 from the output terminal of the gate control circuit G4. For this reason, the transistor M23 changes from the off state to the on state. A current Ib thereby flows in a current path of the transistor M23. The current Ib is for example 10 mA.

The current Ib is drawn into the ground voltage GND node from the gate of the high-side driver M1 via the transistor M23, so that the voltage of the gate of the high-side driver M1 is lowered. As a result, the voltage of the gate of the high-side driver M1 rapidly decreases to 15 V from 20 V.

The gate control circuit G4 supplies 5 V to the gate of the transistor M23 until the voltage of the gate of the high-side driver M1 is stepped down to 15 V. If the voltage of the gate of the high-side driver M1 is stepped down to 15 V, the gate control circuit G4 stops the supply of 5 V.

By the above-described operation, at time t6, 20 V is output from the output terminal TO as the output voltage VOX. As described above, the current Ib flowing from the gate of the high-side driver M1 to the ground voltage GND node rapidly steps down the voltage of the gate of the high-side driver M1 from 20 V to 15 V. For this reason, the high-side driver M1 rapidly changes from the off state to the on state. Thus, as indicated by SR4 in FIG. 11, the output voltage VOX that is output from the output terminal TO is rapidly boosted from 0 V to 20 V. In other words, the slew rate of the output voltage VOX can be improved.

As described above, at time t6 to t7, the output voltage VOX is thus set to 20 V as a result of the interruption of the supply of 0 V from the low-side driver M0 to the output terminal TO and the supply of 20 V from the high-side driver M1 to the output terminal TO.

In the present embodiment, the gate withstand voltage protection circuit 22 is provided in case the gate control circuit G4 cannot restrict the voltage of the gate of the high-side driver M1. The gate withstand voltage protection circuit 22 operates in a case where the source-gate voltage of the high-side driver M1 is restricted to be equal to or lower than the source-gate withstand voltage by the gate control circuit G4. The gate withstand voltage protection circuit 22 prevents the source-gate voltage of the high-side driver M1 from becoming higher than the source-gate withstand voltage as a consequence of the current Ib flowing into the high-side driver M1.

For example, the gate control circuit G4 receives the voltage of the gate of the high-side driver M1 and the control signal SB1 (the voltage of the node B1), and outputs a signal (e.g., 5 V) for setting the transistor M23 to the on state if the voltage of the gate of the high-side driver M1 is higher than 15V. Then, if the voltage of the gate of the high-side driver M1 is stepped down to 15 V or lower, the gate control circuit G4 outputs a signal (e.g., 0 V) for setting the transistor M23 to the off state. For this reason, the current Ib flows into the ground voltage GND node from the gate of the high-side driver M1 until the voltage of the gate of the high-side driver M1 is stepped down to 15 V or lower. Then, if the voltage of the gate of the high-side driver M1 is stepped down to 15 V or lower, the current Ib flowing into the ground voltage GND node from the gate of the high-side driver M1 stops. For this reason, the voltage of the gate of the high-side driver M1 is thereby restricted to 15 V or higher. As a result, the gate voltage decreases, and it is thereby possible to prevent destruction of the high-side driver M1 that can be caused by the source-gate voltage becoming higher than the source-gate withstand voltage.

The resistor element R2 is coupled between the source of the transistor M23 and the ground voltage GND node. The resistor element R2 adjusts the current Ib that flows in a current path of the transistor M23, when the transistor M23 is set to the on state. It is possible to adjust the speed of the voltage of the gate of the high-side driver M1 dropping from 20 V to 15 V by adjusting the current value of the current Ib with the resistor element R2.

In the operation according to the second embodiment, a deadtime is provided after the high-side driver M1 is set to the off state and before the low-side driver M0 starts a transition from the off state to the on state. For example, at time t1, the voltage of the gate of the high-side driver M1 is set to 20 V, and the high-side driver M1 is set to the off state. Thereafter, at time t2, the transition of the voltage of the gate of the low-side driver M0 from 0 V to 5 V is started, and the transition of the low-side driver M0 from the off state to the on state is started.

Similarly, a deadtime is provided after the low-side driver M0 is set to the off state and before the high-side driver M1 starts a transition from the off state to the on state. For example, at time t4, the voltage of the gate of the low-side driver M0 is set to 0 V, and the high-side driver M1 is set to the off state. Thereafter, at time t5, the transition of the voltage of the gate of the high-side driver M1 from 20 V to 15 V is started, and the transition of the high-side driver M1 from the off state to the on state is started.

Thus, a malfunction, such as a short-circuit between the power supply voltage VDD and the ground voltage GND, is avoided by providing a duration of time during which both the high-side driver M1 and the low-side driver M0 are in the off state when the on state of the high-side driver M1 and the low-side driver M0 is switched.

2.3 Modifications of Semiconductor Device

Next, modifications of the semiconductor device according to the second embodiment are described.

In the semiconductor device 2 shown in FIG. 10, the control signals SA1 and SB1 are directly input as an electric signal to the low-side predriver 10 and the high-side predriver 20 respectively, similarly to the first embodiment; alternatively, as shown in FIG. 4, the transmit circuit 31 and the receive circuit 32 electrically insulated from each other may be provided in the input stages of the low-side predriver 10 and the high-side predriver 20 so that a signal is transmitted from the transmit circuit 31 to the receive circuit 32.

The transmission of the signal from the transmit circuit 31 to the receive circuit 32 is achieved by a use of an optical signal, a magnetic signal, or an electric field signal, for example, as shown in FIGS. 5, 6, and 7.

A variable resistor element having a temperature dependency may be used instead of the resistor elements R1 and R2. Replacing the resistor elements R1 and R2 with variable resistance elements prevents degradation of a current driving capability, which is caused by an increase of the "on" resistances of the low-side driver M0 and the high-side driver M1 when the temperature of the semiconductor device 1E rises. Hereinafter, Modification 1 where variable resistor elements are included instead of the resistor elements R1 and R2 is described.

Figure 12:
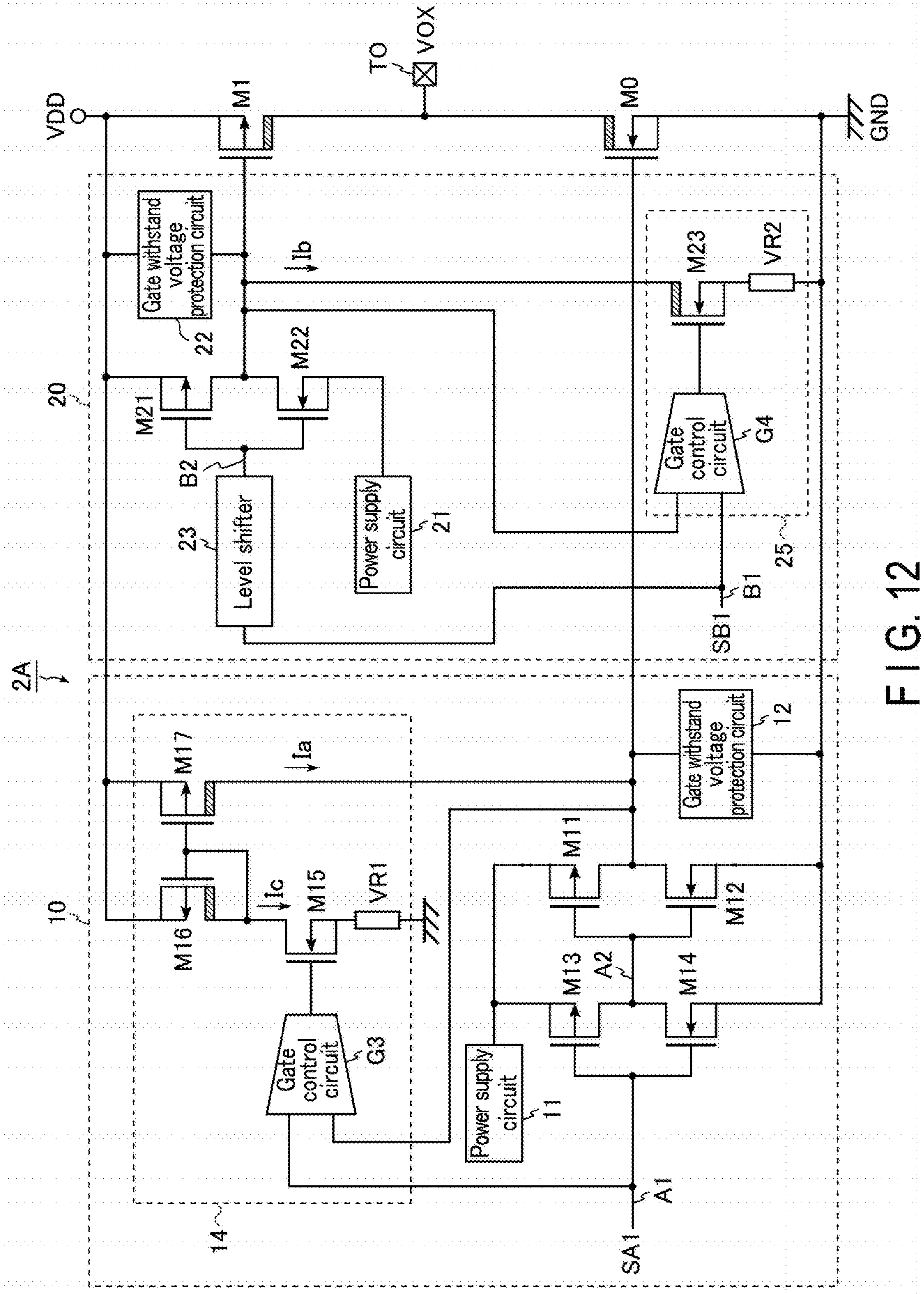
FIG. 12 is a circuit diagram showing a configuration of Modification 1 of the semiconductor device according to the second embodiment.

FIG. 12 is a circuit diagram showing a configuration of Modification 1 of the second embodiment. The semiconductor device 2A includes variable resistor elements VR1 and VR2 that have a temperature dependency instead of the resistor elements R1 and R2. The operation and advantageous effects of Modification 1 are the same as those of Modification 5 of the first embodiment shown in FIG. 8; therefore, detailed description thereof is omitted.

As described in the above, if the temperature of the semiconductor device 2A rises, for example, the "on" resistance of the low-side driver M0 increases, and the current driving capability is degraded. For this reason, increasing the current Ia rapidly changes the voltage of the gate of the low-side driver M0 from 0 V to 5 V. The degraded current driving capability of the low-side driver M0 is thus compensated. Similarly, increasing the current Ib rapidly changes the voltage of the gate of the high-side driver M1 from 20 V to 15 V. The degraded current driving capability of the high-side driver M1 is thus compensated.

A diode may be provided between the transistor M12, the gate of the low-side driver M0 and the transistor M11 for supplying a voltage V1. Another diode may be provided between the transistor M21, the gate of the high-side driver M1 and the transistor M22 for supplying a voltage V2. The provision of the diode prevents a current from flowing from the gate of the low-side driver M0 to the power supply circuit 11. Alternatively, a current is prevented from flowing from the power supply circuit 21 to the gate of the high-side driver M1. Hereinafter, Modification 2 in which diodes are provided is described.

Figure 13:
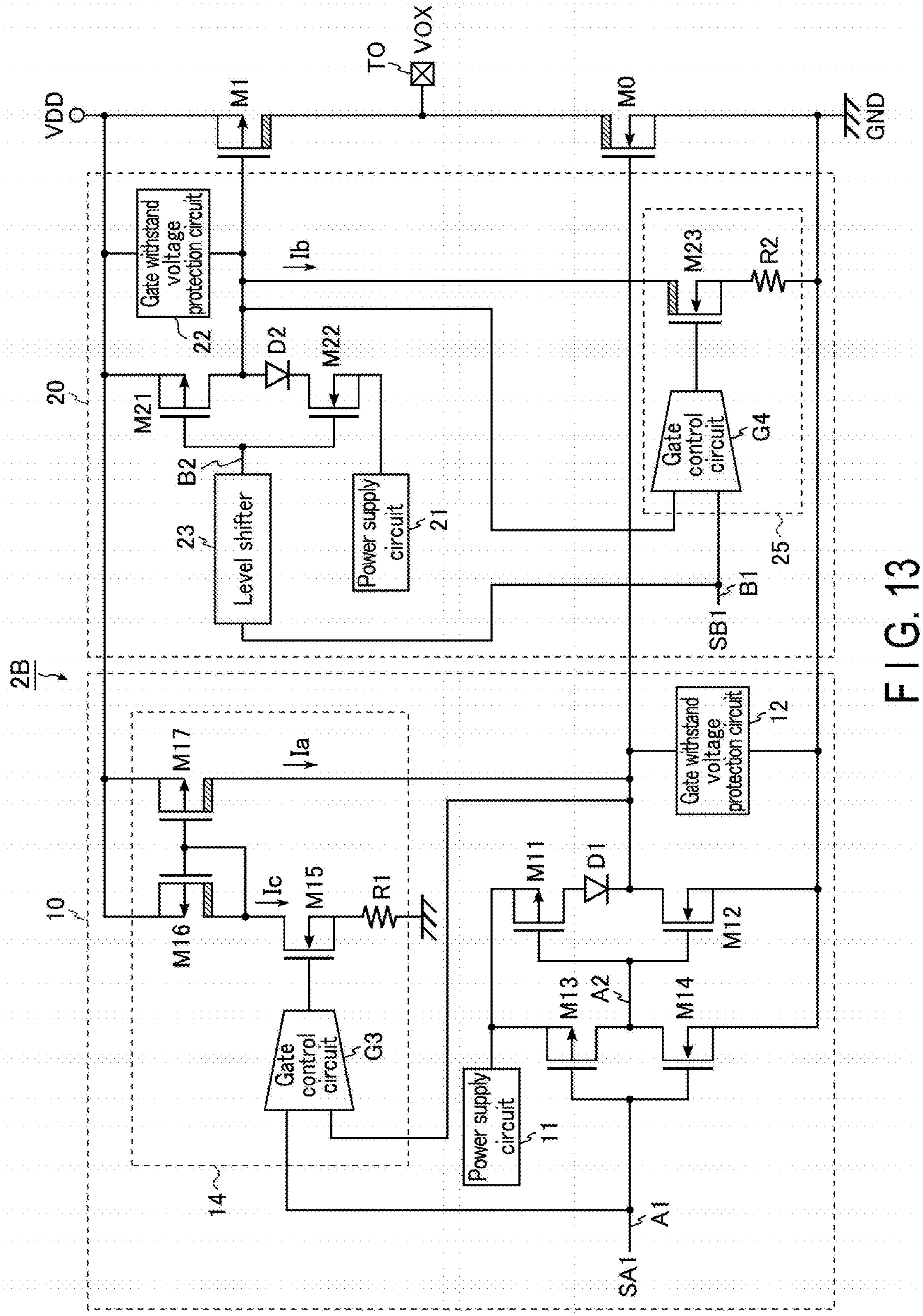
FIG. 13 is a circuit diagram showing a configuration of Modification 2 of the semiconductor device according to the second embodiment.

FIG. 13 is a circuit diagram showing a configuration of Modification 2 of the second embodiment. The semiconductor device 2B includes a diode D1 between the transistor M12, the gate of the low-side driver M0 and the transistor M11 for supplying a voltage V1 from the power supply circuit 11. Furthermore, the semiconductor device 2B includes a diode D2 between the transistor M22, the gate of the high-side driver M1 and a transistor M22 for supplying a voltage V2 from the power supply circuit 21. The operation and advantageous effects of Modification 2 are the same as those of Modification 6 of the first embodiment shown in FIG. 9; therefore, detailed description thereof is omitted.

2.4 Effects of Second Embodiment

According to a semiconductor device that includes a gate driver of the second embodiment, it is possible to improve a slew rate of an output voltage.

According to the configuration of the second embodiment, by providing the gate booster circuit 14 that supplies the current Ia to the gate of the low-side driver M0 from the power supply voltage VDD node, which differs from the power supply circuit 11 that is provided in the semiconductor device as an internal power supply circuit, the voltage of the gate of the low-side driver M0 can be rapidly boosted from 0 V to 5 V. It is thereby possible to rapidly change the low-side driver M0 from the off state to the on state and to improve a slew rate of an output voltage that is output from the low-side driver M0. By providing the gate step-down circuit 25 that causes the current Ib to flow from the gate of the high-side driver M1 to the ground voltage GND node, the voltage of the gate of the high-side driver M1 can be rapidly stepped down from 20 V to 15 V. It is thereby possible to rapidly change the high-side driver M1 from the off state to the on state and to improve a slew rate of an output voltage that is output from the high-side driver M1.

The configuration of the second embodiment includes the gate control circuit G3 that monitors the voltage of the gate of the low-side driver M0 and outputs the voltage for setting the transistor M15 to the off state if the gate-source voltage exceeds a preset threshold voltage. The gate control circuit G3 outputs the signal for setting the transistor M15 to the on state until the gate-source voltage of the low-side driver M0 reaches a voltage (5 V) that changes the low-side driver M0 to the on state. Then, if the voltage of the gate of the low-side driver M0 reaches the voltage that changes the low-side driver M0 to the on state, the gate control circuit G3 outputs the signal for setting the transistor M15 to the off state. It is thereby possible to prevent destruction of the low-side driver M0 that can be caused by the increase of the gate voltage and by the gate-source voltage becoming higher than a gate-source withstand voltage.

The configuration of the second embodiment includes the gate control circuit G4 that monitors the voltage of the gate of the high-side driver M1 and outputs the voltage for setting the transistor M23 to the off state if the source-gate voltage reaches a preset threshold voltage or higher. The gate control circuit G4 outputs the signal for setting the transistor M23 to the on state until the voltage of the gate of the high-side driver M1 reaches a voltage (15 V) that changes the high-side driver M1 to the on state. Then, if the voltage of the gate of the high-side driver M1 reaches the voltage that changes the high-side driver M1 to the on state, the gate control circuit G4 outputs the signal for setting the transistor M23 to the off state. As a result, the gate voltage decreases, and it is thereby possible to prevent destruction of the high-side driver M1 caused by the source-gate voltage becoming higher than the source-gate withstand voltage.

According to the configuration of the second embodiment, through the provision of a device or a circuit for increasing the current Ia and Ib as the temperature of the semiconductor device rises, it is possible to improve a slew rate of the output voltage that is output from the low-side driver M0 and the high-side driver M1 even in the case where the temperature rises.

3. Third Embodiment

A semiconductor device according to the third embodiment is described. In the third embodiment, an example where a time required by the gate-source voltage of the low-side driver M0 to reach a threshold voltage can be shortened by providing a capacitor in a path in which the current Ia flows from the power supply voltage VDD node to the gate of a transistor that constitutes the low-side driver M0, will be described. Similarly, an example where a time required by the source-gate voltage of the high-side driver M1 to reach a threshold voltage can be shortened by providing a capacitor in a path in which the current Ib flows from the gate of a transistor that constitutes the high-side driver M1 to the ground voltage GND node, will be described. The explanation of the third embodiment will focus mainly on the points that differ from the first embodiment.

3.1 Configuration of Semiconductor Device

The overall configuration of the semiconductor device according to the third embodiment is similar to that of the first embodiment shown in FIG. 1. Herein, explanation of the overview configuration of the semiconductor device is omitted and the detailed configuration is explained.

Figure 14:
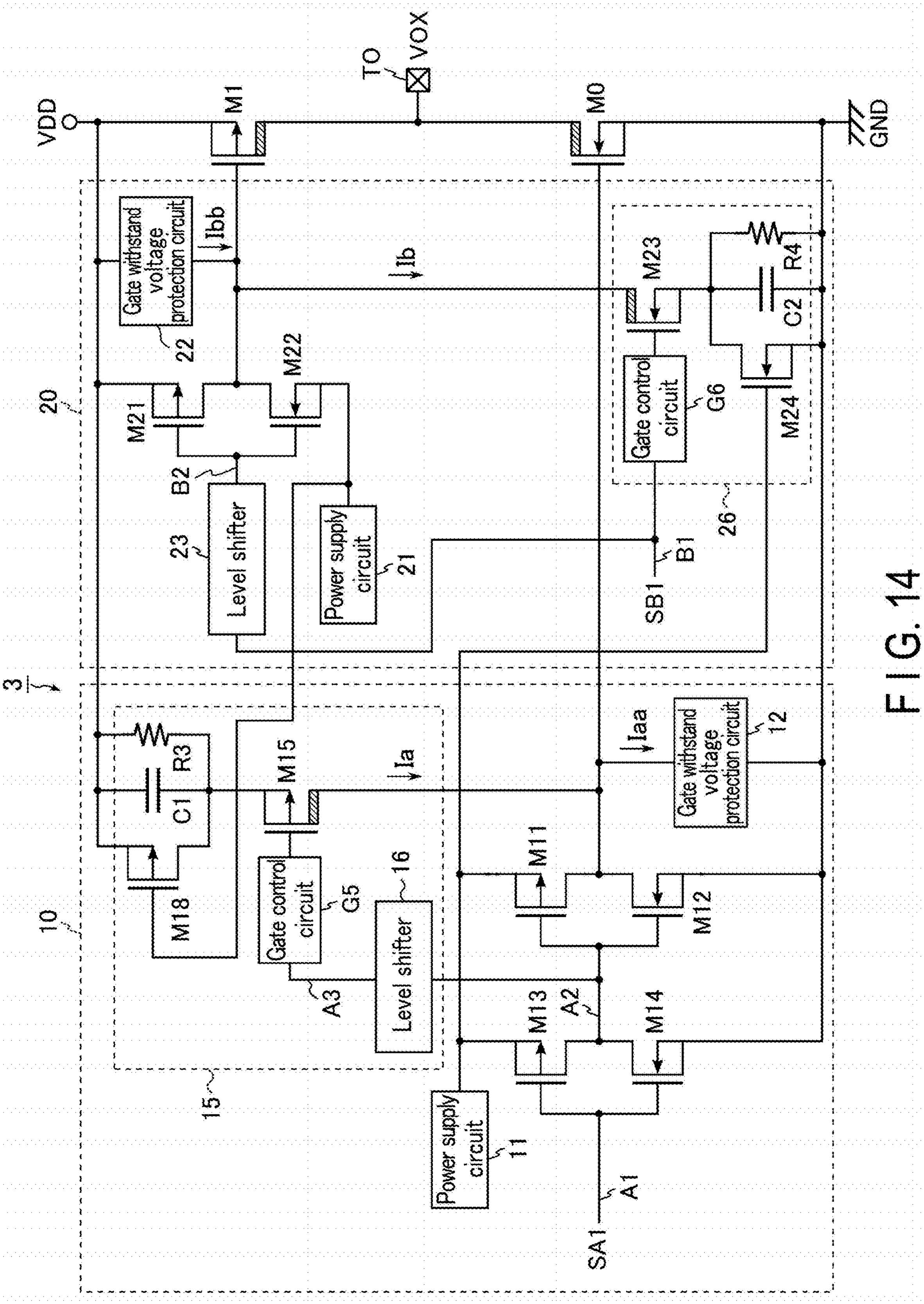
FIG. 14 is a circuit diagram showing a detailed configuration of a semiconductor device according to a third embodiment.

FIG. 14 is a circuit diagram showing a detailed configuration of the semiconductor device according to the third embodiment.

The semiconductor device 3 of the third embodiment includes a low-side driver M0, a high-side driver M1, a low-side predriver 10, and a high-side predriver 20.

The low-side predriver 10 includes transistors M11, M12, M13, and M14, a power supply circuit 11, a gate withstand voltage protection circuit 12, and a gate booster circuit 15.

The power supply circuit 11 supplies a voltage V1 as an internal power supply voltage in the semiconductor device 3. The voltage V1 is 5 V, for example.

The gate withstand voltage protection circuit 12 restricts a voltage of a gate in such a manner that the gate-source voltage of the low-side driver M0 does not exceed the gate-source withstand voltage, so as to protect the low-side driver M0. If the voltage of the gate of the low-side driver M0 exceeds 5 V, the gate withstand voltage protection circuit 12 causes a current to flow from the gate of the low-side driver M0 to the ground voltage GND node so as to step down the voltage of the gate, so that the voltage of the gate does not become higher than 5 V.

The gate booster circuit 15 supplies the current Ia to the gate of the low-side driver M0 from the power supply voltage VDD node and the capacitor C1 to boost the voltage of the gate of the low-side driver M0. The gate booster circuit 15 includes transistors M15 and M18, a resistor element R3, a capacitor C1, a level shifter 16, and a gate control circuit G5.

The level shifter 16 convers a voltage level of a signal supplied to the node A2, and outputs the converted signal. For example, the level shifter 16 outputs 20 V if the signal supplied to the node A2 is 5 V, and outputs 15 V if the signal supplied to the node A2 is 0 V.

The gate control circuit G5 receives an output signal from the level shifter 16, and outputs a signal based on the output signal to the gate of the transistor M15.

The high-side predriver 20 includes transistors M21 and M22, a power supply circuit 21, a gate withstand voltage protection circuit 22, a level shifter 23, and a gate step-down circuit 26.

The power supply circuit 21 supplies a voltage V2 as an internal power supply voltage in the semiconductor device 3. The voltage V2 is 15 V, for example.

The gate withstand voltage protection circuit 22 restricts a voltage of the gate in such a manner that the source-gate voltage of the high-side driver M1 does not exceed the source-gate withstand voltage, so as to protect the high-side driver M1. If the voltage of the gate becomes lower than 15 V, the gate withstand voltage protection circuit 22 causes a current to flow from the power supply voltage VDD node to the gate of the high-side driver M1 so as to boost the voltage of the gate of the high-side driver M1, so that the voltage of the gate of the high-side driver M1 does not become lower than 15 V.

The level shifter 23 converts a voltage level of the control signal SB1 to be input thereto, and outputs the converted voltage level. For example, the level shifter 23 outputs at 20 V if the control signal SB1 is 5 V, and outputs at 15 V if the control signal SB1 is 0 V.

The gate step-down circuit 26 supplies the current Ib to the ground voltage GND node from the gate of the high-side driver M1 to step down the voltage of the gate of the high-side driver M1. The gate step-down circuit 26 includes transistors M23 and M24, a resistor element R4, a capacitor C2, and a gate control circuit G6.

The gate control circuit G6 receives the control signal SB1, and outputs a signal based on the control signal SB1 to the gate of the transistor M23.

Hereinafter, the circuit coupling of the semiconductor device 3 shown in FIG. 14 is described.

The control signal SA1 is input into the node A1. The node A1 is coupled to the gate of the transistor M13 and the gate of the transistor M14.

The drain of the transistor M13 is coupled to the drain of the transistor M14. The drains of the transistors M13 and M14 are coupled to the node A2. The node A2 is coupled to the gate of the transistor M11 and the gate of the transistor M12. The output terminal of the power supply circuit 11 is connected to the source of the transistor M13 and the source of the transistor M11.

The drain of the transistor M11 is coupled to the drain of the transistor M12. The drains of the transistors M11 and M12 are coupled the gate of the low-side driver M0. The source of the transistor M14, the source of the transistor M12, and the source of the low-side driver M0 are coupled to the ground voltage GND node.

The gate withstand voltage protection circuit 12 is coupled between the gate of the low-side driver M0 and the ground voltage GND node.

The node A2 is coupled to the input terminal of the level shifter 16. The output terminal of the level shifter 16 is coupled to the node A3, and the node A3 is coupled to the input terminal of the gate control circuit G5. The output terminal of the gate control circuit G5 is coupled to the gate of the transistor M15.

The source of the transistor M15 is coupled to one end of the resistor element R3, one end of the capacitor C1, and the drain of the transistor M18. The other end of the resistor element R3, the other end of the capacitor C1, and the source of the transistor M18 are coupled to the power supply voltage VDD node. In other words, the resistor element R3, the capacitor C1, and a current path of the transistor M18 are coupled in parallel between the power supply voltage VDD node and the source of the transistor M15. The gate of the transistor M18 is coupled to the output terminal of the power supply circuit 21. Furthermore, the drain of the transistor M15 is coupled the gate of the low-side driver M0.

The control signal SB1 is input into the node B1. The node B1 is coupled to the input terminal of the level shifter 23. The output terminal of the level shifter 23 is coupled to the node B2. The node B2 is coupled to the gate of the transistor M21 and the gate of the transistor M22.

The drain of the transistor M21 is coupled to the drain of the transistor M22. The drains of the transistors M21 and M22 are coupled to the gate of the high-side driver M1. The source of the transistor M22 is coupled to the output terminal of the power supply circuit 21.

The source of the transistor M21 and the source of the high-side driver M1 are coupled to the power supply voltage VDD node.

The gate withstand voltage protection circuit 22 is coupled between the gate of the high-side driver M1 and the power supply voltage VDD node.

The node B1 is coupled to the input terminal of the gate control circuit G6. The output terminal of the gate control circuit G6 is coupled to the gate of the transistor M23. The drain of the transistor M23 is coupled to the gate of the high-side driver M1. The source of the transistor M23 is coupled to one end of the resistor element R4, one end of the capacitor C2, and the drain of the transistor M24. The other end of the resistor element R4, the other end of the capacitor C2, and the source of the transistor M24 are coupled to the ground voltage GND node. In other words, the resistor element R4, the capacitor C2, and a current path of the transistor M24 are coupled in parallel between the source of the transistor M23 and the ground voltage GND node. The gate of the transistor M24 is coupled to the output terminal of the power supply circuit 11.

The drain of the low-side driver M0 and the drain of the high-side driver M1 are coupled to the output terminal TO.

3.2. Operation in Third Embodiment

Figure 15:
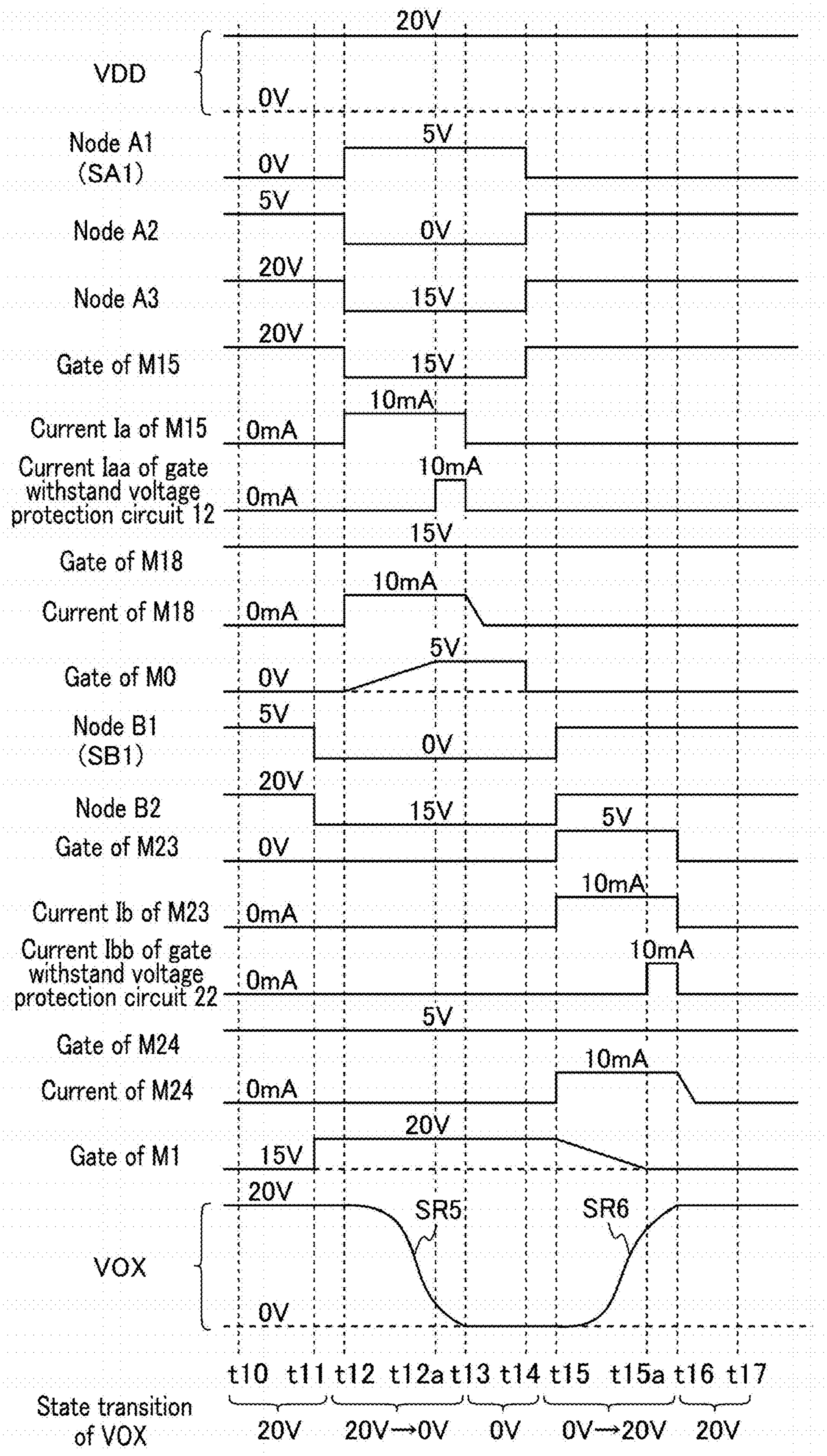
FIG. 15 is a timing chart showing an operation in the semiconductor device according to the third embodiment.

Next, an operation of the semiconductor device 3 according to the third embodiment is described. FIG. 15 is a timing chart showing an operation of the semiconductor device of the third embodiment and illustrating a voltage and a current of each part in the semiconductor device 3.

The operations in the cases where the output voltage VOX that is output from the output terminal TO of the semiconductor device 3 changes (1) from 20 V to 0 V and (2) from 0 V to 20 V are described. The low-side driver M0 is supplied with the ground voltage (for example, 0 V), and the high-side driver M1 is supplied with the power supply voltage (for example, 20 V). The control signal SA1 is input into the node A1, and the control signal SB1 is input into the node B1.

(1) Case where the Output Voltage VOX Changes from 20 V to 0 V

First, at time t10, 20 V is output from the output terminal TO as the output voltage VOX. At this time, the control signal SA1 that is input into the node A1 is set to “L”, for example 0 V, and the output voltage of the gate control circuit G5 is set to 20 V. The control signal SB1 that is input into the node B1 is set to “H”, for example 5 V, and the output voltage of the gate control circuit G6 is set to 0 V.

Next, at time t1*l*, the control signal SB1 is set to “L”. Then, the output voltage of the level shifter 23 is stepped down from 20 V to 15 V, and the voltage of node B2 is set to 15 V. For this reason, 15 V is supplied to the gate of the transistor M21. The source of the transistor M21 is supplied with 20 V from the power supply voltage VDD node. The transistor M21 thereby changes from the off state to the on state.

On the other hand, 15 V is supplied to the gate of the transistor M22, and 15 V is supplied from the power supply circuit 21 to the source of the transistor M22. For this reason, the transistor M22 changes from the on state to the off state.

If the transistor M21 is set to the on state and the transistor M22 is set to the off state, 20 V is supplied to the gate of the high-side driver M1. The source of the high-side driver M1 is supplied with 20 V. For this reason, the high-side driver M1 changes from the on state to the off state. The high-side driver M1 thereby stops the supply of 20 V to the output terminal TO.

Next, at time t12, the control signal SA1 is set to “H”. Then, the voltage of the node A1 is set to 5 V. For this reason, 5 V is supplied to the gate of the transistor M13. The source of the transistor M13 is supplied with 5 V from the power supply circuit 11. For this reason, the transistor M13 changes from the on state to the off state.

On the other hand, 5 V is supplied to the gate of the transistor M14, and 0 V is supplied to the source of the transistor M14. For this reason, the transistor M14 changes from the off state to the on state. The voltage of the node A2 is thereby set to 0 V.

If the node A2 is set to 0 V, the gate of the transistor M11 is supplied with 0 V. The source of the transistor M11 is supplied with 5 V from the power supply circuit 11. For this reason, the transistor M11 changes from the off state to the on state.

On the other hand, 0 V is supplied to the gate of the transistor M12, and 0 V is supplied to the source of the transistor M12. For this reason, the transistor M12 changes from the on state to the off state.

If the transistor M11 is set to the on state and the transistor M12 is set to the off state, 5 V is supplied to the gate of the low-side driver M0 from the power supply circuit 11. The voltage of the gate of the low-side driver M0 thereby starts a transition from 0 V to 5 V. The source of the low-side driver M0 is supplied with 0 V. For this reason, if the voltage of the gate of the low-side driver M0 changes to 5 V, the low-side driver M0 changes from the off state to the on state. The low-side driver M0 thereby stops the supply of 0 V to the output terminal TO.

At time t12, the control signal SA1 is set to “H”, and the voltage of the node A2 is set to 0 V, the output voltage of the level shifter 16 is stepped down from 20 V to 15 V, and the voltage of the node A3 is set to 15 V. Then, 15 V is output from the gate control circuit G5 to the gate of the transistor M15. 15 V is supplied from the power supply circuit 21 to the gate of the transistor M18, and 20 V is supplied to the source of the transistor M18. For this reason, the transistor M18 is set to the on state. If the node M18 is set to the on state, the source of the transistor M15 is supplied with 20 V. For this reason, the transistor M15 changes from the off state to the on state. A current Ia thereby flows in a current path of the transistor M15. The current Ia is for example 10 mA.

Herein, the capacitor C1 is provided between the power supply voltage VDD node and the source of the transistor M15. For this reason, the current Ia rapidly flows into the gate of the low-side driver M0 from the capacitor C1 via the transistor M15, and rapidly charges the gate of the low-side driver M0, and the voltage of the gate of the low-side driver M0 is thereby boosted to a threshold voltage of the low-side driver M0 or higher. The current Ia serves as a booster current to boost the voltage of the gate of the low-side driver M0 from 0 V to 5 V. As a result, the voltage of the gate of the low-side driver M0 is rapidly boosted from 0 V to 5 V.

By the above-described operation, at time t13, 0 V is output from the output terminal TO as the output voltage VOX. As described above, the current Ia flowing from the power supply voltage VDD into the gate of the low-side driver M0 rapidly boosts the voltage of the gate of the low-side driver M0 from 0 V to 5 V. For this reason, the low-side driver M0 changes from the off state to the on state. Thus, as indicated by SR5 in FIG. 15, the output voltage VOX that is output from the output terminal TO rapidly decreases from 20 V to 0 V. In other words, it is possible to accelerate a time until the gate-source voltage of the low-side driver M0 reaches a threshold voltage and to shorten a time between when the control signal SA1 is set to "H" and when the output voltage VOX starts changing. It is further possible to improve the slew rate of the output voltage VOX.

As described above, the output voltage VOX is thus set to 0 V at time t13 to t14 as a result of the interruption of the supply of 20 V from the high-side driver M1 to the output terminal TO and the supply of 0 V from the low-side driver M0 to the output terminal TO.

The gate withstand voltage protection circuit 12 is provided between the gate of the low-side driver M0 and the ground voltage GND node. The gate withstand voltage protection circuit 12 prevents the gate-source voltage of the low-side driver M0 from becoming higher than the gate-source withstand voltage as a consequence of the current Ia flowing into the low-side driver M0.

If the current Ia flows from the power supply voltage VDD node and the capacitor C1 into the gate of the low-side driver M0, the voltage of the gate of the low-side driver M0 is boosted. At a timing at which the voltage of the gate of the low-side driver M0 reaches 5 V, the gate withstand voltage protection circuit 12 starts an operation. For this reason, a current Iaa flows from the gate of the low-side driver M0 to the ground voltage GND node via the gate withstand voltage protection circuit 12, and the voltage of the gate of the low-side driver M0 is stepped down. The gate-source voltage of the low-side driver M0 is thereby restricted to 5 V or lower. To give more detail, a current Ia starts flowing from the power supply voltage VDD node to the gate of the low-side driver M0 at time t12. If the voltage of the gate of the low-side driver M0 reaches 5V at time t12*a*, which is earlier than time t13, the gate withstand voltage protection circuit 12 starts an operation, and the current Iaa starts flowing from the gate of the low-side driver M0 to the ground voltage GND node. Then, at time t13, the flow of the current Ia and the current Iaa is stopped. It is thereby possible to prevent the destruction of the low-side driver M0 that can be caused by applying a voltage higher than the gate-source withstand voltage to the gate.

(2) Case where the Output Voltage VOX Changes from 0 V to 20 V

At time t13, 0 V is output from the output terminal TO as the output voltage VOX. At this time, the control signal SA1 that is input into the node A1 is set to "H", for example 5 V, and the output voltage of the gate control circuit G5 is set to 15 V. The control signal SB1 that is input into the node B1 is set to "L", for example 0 V, and the output voltage of the gate control circuit G6 is set to 0 V.

Next, at time t14, the control signal SA1 is set to "L". Then, the voltage of the node A1 is set to 0 V. For this reason, 0 V is supplied to the gate of the transistor M13. The source of the transistor M13 is supplied with 5 V from the power supply circuit 11. The transistor M13 thereby changes from the off state to the on state.

On the other hand, 0 V is supplied to the gate of the transistor M14, and 0 V is supplied to the source of the transistor M14. For this reason, the transistor M14 changes from the on state to the off state. The voltage of the node A2 is thereby set to 5 V.

If the node A2 is set to 5 V, the gate of the transistor M11 is supplied with 5 V. The source of the transistor M11 is supplied with 5 V from the power supply circuit 11. For this reason, the transistor M11 changes from the on state to the off state.

On the other hand, 5 V is supplied to the gate of the transistor M12, and 0 V is supplied to the source of the transistor M12. For this reason, the transistor M12 changes from the off state to the on state.

If the transistor M11 is set to the off state and the transistor M12 is set to the on state, the supply of 0 V to the gate of the low-side driver M0 commences. The voltage of the gate of the low-side driver M0 thereby starts a transition from 5 V to 0 V. The source of the low-side driver M0 is supplied with 0 V. For this reason, if the voltage of the gate of the low-side driver M0 changes to 0 V, the low-side driver M0 changes from the on state to the off state. The low-side driver M0 thereby stops the supply of 0 V to the output terminal TO.

Next, at time t15, the control signal SB1 is set to "H". Then, the output voltage of the level shifter 23 is boosted from 15 V to 20 V, and the voltage of node B2 is set to 20 V. For this reason, the gate of the transistor M21 is supplied with 20 V. The source of the transistor M21 is supplied with 20 V. For this reason, the transistor M21 changes from the on state to the off state.

On the other hand, 20 V is supplied to the gate of the transistor M22, and 15 V is supplied from the power supply circuit 21 to the source of the transistor M22. For this reason, the transistor M22 changes from the off state to the on state.

If the transistor M21 is set to the off state and the transistor M22 is set to the on state, 15 V is supplied to the gate of the high-side driver M1 from the power supply circuit 21. The voltage of the gate of the high-side driver M1 thereby starts a transition from 20 V to 15 V. The source of the high-side driver M1 is supplied with 20 V. For this reason, if the voltage of the gate of the high-side driver M1 changes to 15 V, the high-side driver M1 changes from the off state to the on state. The high-side driver M1 thereby starts the supply of 20 V to the output terminal TO.

At time t15, the control signal SB1 is set to "H". Then, 5 V is output from the gate control circuit G6 to the gate of the transistor M23. If 5 V is supplied to the transistor M23, the transistor M23 changes from an off state to an on state. A current Ib thereby flows in a current path of the transistor M23. The current Ib is for example 10 mA.

Herein, the capacitor C2 is provided between the source of the transistor M23 and the ground voltage GND node. For this reason, the current Ib is drawn into the capacitor C2 from the gate of the high-side driver M1 via the transistor M23, so that the voltage of the gate of the high-side driver M1 is stepped down. As a result, the voltage of the gate of the high-side driver M1 is rapidly stepped down to 15 V from 20 V.

By the above-described operation, at time t16, 20 V is output from the output terminal TO as the output voltage VOX. As described above, the current Ib flowing from the gate of the high-side driver M1 to the capacitor C2 rapidly steps down the voltage of the gate of the high-side driver M1 from 20 V to 15 V. For this reason, the high-side driver M1 rapidly changes from the off state to the on state. Thus, as indicated by SR6 in FIG. 15, the output voltage VOX that is output from the output terminal TO is rapidly boosted from 0 V to 20 V. In other words, the slew rate of the output voltage VOX can be improved.

As described above, at time t16 to t17, the output voltage VOX is thus set to 20 V as a result of interruption of the supply of 0 V from the low-side driver M0 to the output terminal TO and a supply of 20 V from the high-side driver M1 to the output terminal TO.

The gate withstand voltage protection circuit 22 is provided between the power supply voltage VDD node and the gate of the high-side driver M1. The gate withstand voltage protection circuit 22 prevents the gate-source voltage of the high-side driver M1 from becoming higher than the gate-source withstand voltage as a consequence of the current Ib flowing from the gate of the high-side driver M1. The gate withstand voltage protection circuit 22 prevents the voltage of the gate of the high-side driver M1 from becoming lower than 15 V, for example.

If the current Ib flows from the gate of the high-side driver M1 to the capacitor C2, the voltage of the gate of the high-side driver M1 is stepped down. At a timing at which the voltage of the high-side driver M1 is stepped down to 15 V, the gate withstand voltage protection circuit 22 starts an operation. For this reason, the current Ibb flows into the gate of the high-side driver M1 from the power supply voltage VDD node via the gate withstand voltage protection circuit 22 and thereby boosts the voltage of the gate of the high-side driver M1. The voltage of the gate of the high-side driver M1 is thereby restricted to 15 V or higher. To give more detail, the current Ib starts flowing from the gate of the high-side driver M1 to the ground voltage GND node at time t15. If the voltage of the gate of the high-side driver M1 decreases to 15 V at time t15*a*, which precedes time t16, the gate withstand voltage protection circuit 22 starts an operation, and the current Ibb starts flowing from the power supply voltage VDD node to the gate of the high-side driver M1. Then, at time t16, the flow of the current Ib and the current Ibb is stopped. As a result, the gate voltage decreases, and it is thereby possible to prevent the destruction of the high-side driver M1 that can be caused by the source-gate voltage becoming higher than the source-gate withstand voltage.

In the operation according to the third embodiment, a deadtime is provided after the high-side driver M1 is set to the off state and before the low-side driver M0 starts a transition from the off state to the on state. For example, at time t1*l*, the voltage of the gate of the high-side driver M1 is set to 20 V, and the high-side driver M1 is set to the off state. Thereafter, at time t12, the transition of the voltage of the gate of the low-side driver M0 from 0 V to 5 V is started, and the transition of the low-side driver M0 from the off state to the on state is started.

Similarly, a deadtime is provided after the low-side driver M0 is set to the off state and before the high-side driver M1 starts a transition from the off state to the on state. For example, at time t14, the voltage of the gate of the low-side driver M0 is set to 0 V, and the low-side driver M0 is set to the off state. Thereafter, at time t15, the transition of the voltage of the gate of the high-side driver M1 from 20 V to 15 V is started, and the transition of the high-side driver M1 from the off state to the on state is started.

Thus, a malfunction, such as a short-circuit between the power supply voltage VDD and the ground voltage GND, is avoided by providing a duration of time during which both the high-side driver M1 and the low-side driver M0 are in the off state when the on state of the high-side driver M1 and the low-side driver M0 is switched.

3.3 Modifications of Semiconductor Device

Next, modifications of the semiconductor device according to the third embodiment are described.

In the semiconductor device 3 shown in FIG. 14, the control signals SA1 and SB1 are directly input as an electric signal to the low-side predriver 10 and the high-side predriver 20 respectively, similarly to the first embodiment; alternatively, as shown in FIG. 4, the transmit circuit 31 and the receive circuit 32 electrically insulated from each other may be provided in the input stages of the low-side predriver 10 and the high-side predriver 20 so that a signal is transmitted from the transmit circuit 31 to the receive circuit 32.

The transmission of the signal from the transmit circuit 31 to the receive circuit 32 is achieved by use of an optical signal, a magnetic signal, or an electric field signal, for example, as shown in FIGS. 5, 6, and 7.

A diode may be provided between the transistor M12, the gate of the low-side driver M0 and the transistor M11 for supplying a voltage V1. Another diode may be provided between the transistor M21, the gate of the high-side driver M1 and the transistor M22 for supplying a voltage V2. The provision of the diode prevents a current from flowing from the gate of the low-side driver M0 to the power supply circuit 11. Alternatively, a current is prevented from flowing from the power supply circuit 21 to the gate of the high-side driver M1. Hereinafter, Modification 1 in which diodes are provided is described.

Figure 16:
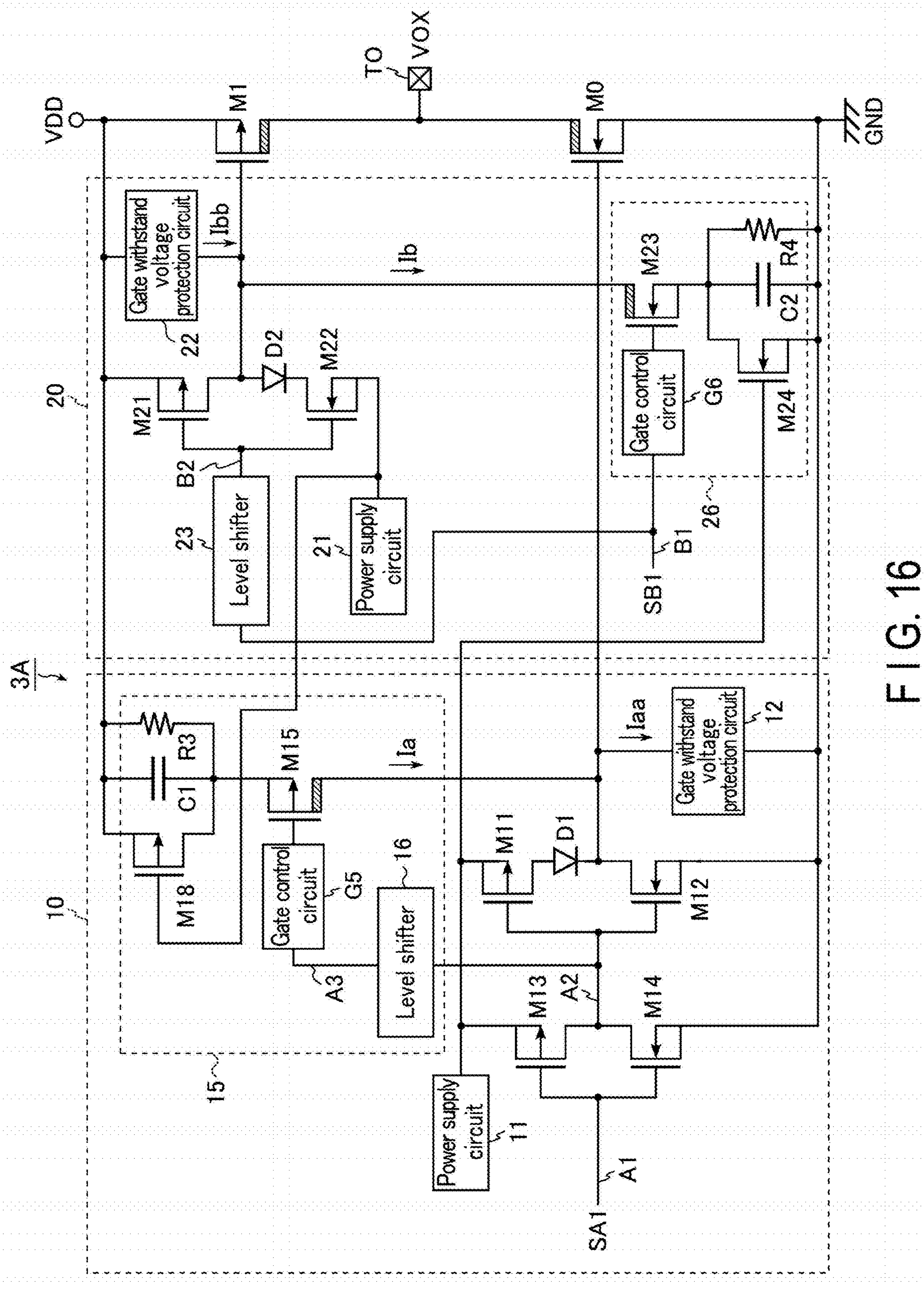
FIG. 16 is a circuit diagram showing a configuration of Modification 1 of the semiconductor device according to the third embodiment.

FIG. 16 is a circuit diagram showing a configuration of Modification 1 of the third embodiment. The semiconductor device 3A includes a diode D1 between transistor M12, the gate of the low-side driver M0 and the transistor M11 for supplying a voltage V1 from the power supply circuit 11. Furthermore, the semiconductor device 3A includes a diode D2 between the transistor M21, the gate of the high-side driver M1 and the transistor M22 for supplying a voltage V2 from the power supply circuit 21. The operation and advantageous effects of Modification 1 are the same as those of Modification 6 of the first embodiment shown in FIG. 9; therefore, detailed description thereof is omitted.

3.3 Effects of Third Embodiment

According to a semiconductor device that includes a gate driver of the third embodiment, it is possible to improve a slew rate of an output voltage.

According to the configuration of the third embodiment, by providing the gate booster circuit 15 that supplies the current Ia to the gate of the low-side driver M0 from the capacitor C1 and the power supply voltage VDD node, which differs from the power supply circuit 11 that is provided in the semiconductor device as an internal power supply circuit, the voltage of the gate of the low-side driver M0 can be rapidly boosted from 0 V to 5 V. It is thereby possible to rapidly change the low-side driver M0 from the off state to the on state and to improve a slew rate of an output voltage that is output from the low-side driver M0. By providing the gate step-down circuit 26 that causes the current Ib to flow from the high-side driver M1 to the ground voltage GND node and the capacitor C2, the voltage of the gate of the high-side driver M1 is rapidly stepped down from 20 V to 15 V. It is thereby possible to rapidly change the high-side driver M1 from the off state to the on state and to improve a slew rate of an output voltage that is output from the high-side driver M1.

With the configuration of the third embodiment, through the provision of the gate withstand voltage protection circuit 12 between the gate of the low-side driver M0 and the ground voltage GND node, it is possible to restrict the gate-source voltage of the low-side driver M0 in such a manner that the gate-source voltage does not exceed the gate-source withstand voltage. It is thereby possible to prevent destruction of the low-side driver M0 that can be caused by the increase of the gate voltage and by the gate-source voltage becoming higher than the gate-source withstand voltage. Through the provision of the gate withstand voltage protection circuit 22 between the power supply voltage VDD node and the gate of the high-side driver M1, it is possible to restrict the source-gate voltage of the high-side driver M1 in such a manner that the source-gate voltage does not exceed the source-gate withstand voltage. As a result, the gate voltage decreases, and it is thereby possible to prevent destruction of the high-side driver M1 caused by the source-gate voltage becoming higher than the source-gate withstand voltage.

4. Others

A semiconductor device according to the foregoing embodiments may take any of the following aspects.

1. A semiconductor device comprising:
   - a first transistor (M0) having a gate-source withstand voltage lower than an externally input power supply voltage (VDD);
   - a first power supply circuit (11) configured to output a first voltage (V1) lower than the externally input power supply voltage;
   - a first circuit (M11, M12) configured to drive a gate of the first transistor (M0) using the first voltage (V1) as a power supply; and
   - a second circuit (13 (14, 15)) configured to supply a first current (Ia) to the gate of the first transistor (M0) from a power supply voltage node to which the externally input power supply voltage is supplied.

2. The semiconductor device described in the above 1, wherein a supply of the first current (Ia) by the second circuit is carried out during a first duration of time in parallel to a supply of the first voltage to the gate of the first transistor (M0) by the first circuit (M11, M12).

3. The semiconductor device described in the above 1 or 2, wherein the second circuit (13) is configured to:
   - supply the first current (Ia) to the gate of the first transistor (M0) from the power supply voltage node until a voltage of the gate of the first transistor (M0) reaches the first voltage (V1), and
   - stop the supply of the first current (Ia) to the gate of the first transistor (M0) from the power supply voltage node if the voltage of the gate of the first transistor (M0) reaches the first voltage (V1).

4. The semiconductor device described in any one of the above 1 to 3, the device comprising:
   - a current mirror circuit including a second transistor (M17) coupled between the power supply voltage node and the gate of the first transistor (M0) and a third transistor (M16) coupled between the power supply voltage node and a ground voltage node to which a ground voltage (GND) is supplied; and
   - a fourth transistor (M15) coupled between the third transistor (M16) and the ground voltage node.

5. The semiconductor device described in the above 4, wherein the second circuit (13) comprises a resistance element (R1) coupled between the fourth transistor (M15) and the ground voltage node.

6. The semiconductor device described in the above 4, wherein the second circuit (13) comprises a resistance element (VR1) coupled between the fourth transistor (M15) and the ground voltage node and whose resistance value changes in accordance with a temperature change.

7. The semiconductor device described in any one of the above 4 to 6, wherein the second circuit (14) comprises a third circuit (G3) whose input terminal is coupled to the gate of the first transistor (M0), whose output terminal is coupled to a gate of the fourth transistor (M15), and which supplies a first signal to the gate of the fourth transistor (M15) in accordance with the voltage of the gate of the first transistor (M0).

8. The semiconductor device described in the above 7, wherein the third circuit (G3) is configured to:
   - supply the first signal for setting the fourth transistor (M15) to an on state if the voltage of the gate of the first transistor (M0) is lower than the first voltage; and
   - supply the first signal for setting the fourth transistor (M15) to an off state if the voltage of the gate of the first transistor (M0) is equal to or higher than the first voltage.

9. The semiconductor device described in the above 1, wherein the second circuit (15) comprises a transistor (M18), a resistance element (R3), and a capacitor (C1) coupled between the power supply voltage node and the gate of the first transistor (M0) in parallel to each other.

10. The semiconductor device described in any one of the above 1 to 9 further comprising:
    - a protection circuit (12) coupled between the gate of the first transistor (M0) and a ground voltage node to which a ground voltage (GND) is supplied and that restricts the voltage of the gate of the first transistor (M0) to a voltage level of the first voltage.

11. The semiconductor device described in any one of the above 1 to 10 further comprising:
    - a transmit circuit (31) configured to receive a second signal and transmit a third signal in accordance with the second signal; and
    - a receive circuit (32) electrically insulated from the transmit circuit and configured to receive the third signal and generate a fourth signal in accordance with the third signal,
    - wherein the first circuit and the second circuit receive the fourth signal and operate based on the fourth signal.

12. The semiconductor device described in the above 11, wherein the third signal transmitted from the transmit circuit to the receive circuit is any one of an optical signal, a magnetic signal, or an electric field signal.

13. The semiconductor device described in any one of the above 1 to 12, wherein
    - the first control circuit comprises:
      - a fifth transistor (M11) and a sixth transistor (M12) coupled to an output terminal of the first power supply circuit (11) and a ground voltage node to which a ground voltage is supplied; and
      - a diode (D1) coupled between the fifth transistor (M11) and the sixth transistor (M12),
    - the first voltage (V1) is supplied to a first end of the fifth transistor (M11),
    - an anode of the diode (D1) is coupled to a second end of the fifth transistor (M11), and a gate of the first transistor (M0) and a first end of the sixth transistor (M12) are coupled to a cathode of the diode (D1), and
    - the ground voltage is supplied to a second end of the sixth transistor (M12).

14. The semiconductor device described in any one of the above 1 to 13, wherein a gate-source withstand voltage of the first transistor (M0) is lower than a drain-source withstand voltage of the first transistor (M0).

15. The semiconductor device described in any one of the above 1 to 14, wherein the first transistor (M0) is a gate driver for driving a gate of a transistor (MX).

16. The semiconductor device described in any one of the above 1 to 15 further comprising:

a seventh transistor (M1) having a source-gate withstand voltage lower than the externally input power supply voltage (VDD);

a second power supply circuit (21) configured to output a second voltage (V2) lower than the externally input power supply voltage;

a fourth circuit (M21, M22) configured to drive a gate of the seventh transistor (M1) using the externally input power supply voltage (VDD) and the second voltage (V2) output from the second power supply circuit (21) as a power supply; and a fifth circuit (24 (25, 26) for supplying a second current (Ib) to a ground voltage node to which a ground voltage is supplied from the gate of the seventh transistor (M1).

17. The semiconductor device described in the above 16, wherein the fifth circuit (24):

supplies the second current (Ib) to the ground voltage node from the gate of the seventh transistor (M1) until a voltage of the gate of the seventh transistor (M1) reaches the second voltage (V2), and stops the supply of the second current (Ib) to the ground voltage node from the gate of the seventh transistor (M1) if the voltage of the gate of the seventh transistor (M1) reaches the second voltage (V2).

18. The semiconductor device described in the above 16 or 17, wherein the fifth circuit (24) comprises:

an eighth transistor (M23) coupled between the gate of the seventh transistor (M1) and the ground voltage node; and a resistance element (R2) coupled between the eighth transistor (M23) and the ground voltage node.

19. The semiconductor device described in the above 18, wherein the fifth circuit (25) comprises a sixth circuit (G4) whose input terminal is coupled to the gate of the seventh transistor (M1), whose output terminal is coupled to a gate of the eighth transistor (M23), and which supplies a fifth signal to the gate of the eighth transistor (M23) in accordance with the voltage of the gate of the seventh transistor (M1).

20. The semiconductor device described in any one of the above 16, wherein the fifth circuit (26) comprises:

an eighth transistor (M23) coupled between the gate of the seventh transistor (M1) and the ground voltage node.

a transistor (M23), a resistor element (R4), and a capacitor (C2) coupled between a source of the eighth transistor and the ground voltage node in parallel to each other.

As a semiconductor device that includes a gate driver according to the present embodiment, a photo coupler or a digital isolator or the like is used, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:

a first transistor having a gate-source withstand voltage lower than an externally input power supply voltage;

a first power supply circuit configured to output a first voltage lower than the externally input power supply voltage;

a first circuit configured to drive a gate of the first transistor using the first voltage as a power supply;

a second circuit configured to supply a first current to the gate of the first transistor from a power supply voltage node to which the externally input power supply voltage is supplied; and a protection circuit that is coupled between the gate of the first transistor and a ground voltage node to which a ground voltage is supplied and that restricts the voltage of the gate of the first transistor to a voltage level of the first voltage.

2. The semiconductor device according to claim 1, wherein a supply of the first current by the second circuit is carried out during a first duration of time in parallel to a supply of the first voltage to the gate of the first transistor by the first circuit.

3. The semiconductor device according to claim 1, wherein the second circuit is configured to:

supply the first current to the gate of the first transistor from the power supply voltage node until a voltage of the gate of the first transistor reaches the first voltage; and stop the supply of the first current to the gate of the first transistor from the power supply voltage node if the voltage of the gate of the first transistor reaches the first voltage.

4. A semiconductor device comprising:

a first transistor having a gate-source withstand voltage lower than an externally input power supply voltage;

a first power supply circuit configured to output a first voltage lower than the externally input power supply voltage;

a first circuit configured to drive a gate of the first transistor using the first voltage as a power supply; and a second circuit configured to supply a first current to the gate of the first transistor from a power supply voltage node to which the externally input power supply voltage is supplied, wherein the second circuit comprises:

a current mirror circuit including a second transistor coupled between the power supply voltage node and the gate of the first transistor and a third transistor coupled between the power supply voltage node and a ground voltage node to which a ground voltage is supplied; and a fourth transistor coupled between the third transistor and the ground voltage node.

5. The semiconductor device according to claim 4, wherein the second circuit comprises a resistance element coupled between the fourth transistor and the ground voltage node.

6. The semiconductor device according to claim 4, wherein the second circuit comprises a resistance element that is coupled between the fourth transistor and the ground voltage node and whose resistance value changes in accordance with a temperature change.

7. The semiconductor device according to claim 4, wherein the second circuit comprises a third circuit whose input terminal is coupled to the gate of the first transistor, whose output terminal is coupled to a gate of the fourth transistor, and which supplies a first signal to the gate of the fourth transistor in accordance with a voltage of the gate of the first transistor.

8. The semiconductor device according to claim 7, wherein the third circuit is configured to:

supply the first signal for setting the fourth transistor to an on state if the voltage of the gate of the first transistor is lower than the first voltage; and supply the first signal for setting the fourth transistor to an off state if the voltage of the gate of the first transistor is equal to or higher than the first voltage.

9. The semiconductor device according to claim 1, wherein the second circuit comprises a transistor, a resistance element, and a capacitor coupled between the power supply voltage node and the gate of the first transistor in parallel to each other.

10. The semiconductor device according to claim 1 further comprising:

a transmit circuit configured to receive a first signal and transmit a second signal in accordance with the first signal; and a receive circuit electrically insulated from the transmit circuit and configured to receive the second signal and generate a third fourth signal in accordance with the second third signal, wherein the first circuit and the second circuit receive the third fourth-signal and operate based on the third signal.

11. The semiconductor device according to claim 10, wherein the second signal transmitted from the transmit circuit to the receive circuit is any one of an optical signal, a magnetic signal, or an electric field signal.

12. The semiconductor device according to claim 1, wherein the first circuit comprises:

a fifth transistor and a sixth transistor coupled between an output terminal of the first power supply circuit and a ground voltage node to which a ground voltage is supplied; and a diode coupled between the fifth transistor and the sixth transistor, wherein the first voltage is supplied to a first end of the fifth transistor, an anode of the diode is coupled to a second end of the fifth transistor, and a cathode of the diode is coupled to the gate of the first transistor and a first end of the sixth transistor, and the ground voltage is supplied to a second end of the sixth transistor.

13. The semiconductor device according to claim 1, wherein the gate-source withstand voltage of the first transistor is lower than a drain-source withstand voltage of the first transistor.

14. The semiconductor device according to claim 1, wherein the first transistor is a gate driver for driving a gate of a transistor.

15. A semiconductor device according to claim 1 further comprising:

a first transistor having a gate-source withstand voltage lower than an externally input power supply voltage;

a first power supply circuit configured to output a first voltage lower than the externally input power supply voltage;

a first circuit configured to drive a gate of the first transistor using the first voltage as a power supply;

a second circuit configured to supply a first current to the gate of the first transistor from a power supply voltage node to which the externally input power supply voltage is supplied;

a seventh transistor having a source-gate withstand voltage lower than the externally input power supply voltage;

a second power supply circuit configured to output a second voltage lower than the externally input power supply voltage;

a fourth circuit configured to drive a gate of the seventh transistor using the externally input power supply voltage and the second voltage output from the second power supply circuit as a power supply; and a fifth circuit for supplying a second current to a ground voltage node to which a ground voltage is supplied from the gate of the seventh transistor.

16. The semiconductor device according to claim 15, wherein the fifth circuit is configured to:

supply the second current to the ground voltage node from the gate of the seventh transistor until a voltage of the gate of the seventh transistor reaches the second voltage, and stop the supply of the second current to the ground voltage node from the gate of the seventh transistor if the voltage of the gate of the seventh transistor reaches the second voltage.

17. The semiconductor device according to claim 15, wherein the fifth circuit comprises:

an eighth transistor coupled between the gate of the seventh transistor and the ground voltage node; and a resistor element coupled between the eighth transistor and the ground voltage node.

18. The semiconductor device according to claim 17, wherein the fifth circuit comprises a sixth circuit whose input terminal is coupled to the gate of the seventh transistor, whose output terminal is coupled to a gate of the eighth transistor, and which supplies a first signal to the gate of the eighth transistor in accordance with a voltage of the gate of the seventh transistor.

19. The semiconductor device according to claim 15, wherein the fifth circuit comprises:

an eighth transistor coupled between the gate of the seventh transistor and the ground voltage node; and a transistor, a resistor element, and a capacitor coupled between a source of the eighth transistor and the ground voltage node in parallel to each other.

* * * * *